(12) United States Patent
Kiuchi et al.

(10) Patent No.: US 7,910,206 B2
(45) Date of Patent: Mar. 22, 2011

(54) SELF-ROLLING LAMINATED SHEET AND SELF-ROLLING PRESSURE-SENSITIVE ADHESIVE SHEET

(75) Inventors: Kazuyuki Kiuchi, Osaka (JP); Akira Shoji, Osaka (JP); Akinori Nishio, Osaka (JP); Kunio Nagasaki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 244 days.

(21) Appl. No.: 11/937,525

(22) Filed: Nov. 9, 2007

(65) Prior Publication Data
US 2008/0131634 A1 Jun. 5, 2008

(30) Foreign Application Priority Data
Nov. 10, 2006 (JP) .............. P. 2006-305671
Oct. 3, 2007 (JP) .............. P. 2007-260077

(51) Int. Cl.
*B32B 7/12* (2006.01)
*B32B 9/00* (2006.01)

(52) U.S. Cl. ....... 428/354; 428/343; 428/352; 428/34.9; 428/40.1; 428/41.7; 428/906

(58) Field of Classification Search ............ None
See application file for complete search history.

(56) References Cited

U.S. PATENT DOCUMENTS

| | | | |
|---|---|---|---|
| 4,569,879 A | 2/1986 | Groves | |
| 6,225,194 B1 | 5/2001 | Noguchi et al. | |
| 6,680,097 B1 | 1/2004 | Amberger et al. | |
| 2002/0025432 A1 | 2/2002 | Noguchi et al. | |
| 2004/0191510 A1* | 9/2004 | Kiuchi et al. | 428/355 RA |
| 2005/0031861 A1* | 2/2005 | Matsumura et al. | 428/354 |
| 2008/0121335 A1* | 5/2008 | Kiuchi et al. | 156/85 |
| 2010/0243159 A1* | 9/2010 | Nishio et al. | 156/344 |
| 2010/0252185 A1* | 10/2010 | Kiuchi et al. | 156/247 |
| 2010/0279491 A1* | 11/2010 | Kiuchi et al. | 438/464 |

FOREIGN PATENT DOCUMENTS

| | | |
|---|---|---|
| GB | 2320615 A | 6/1998 |
| GB | 2363204 A | 12/2001 |
| JP | 2000-129227 A | 5/2000 |
| JP | 3073239 B2 | 6/2000 |
| JP | 2002-203822 A | 7/2002 |
| KR | 10-1998-064239 A | 10/1998 |
| WO | 2006/076327 A1 | 7/2006 |
| WO | 2006/106309 A1 | 10/2006 |

OTHER PUBLICATIONS

Noguchi Isato et al., "Semiconductor Wafer Protective Pressure-Sensitive-Adhesive Sheet and Use Thereof", Machine translation of JP 2000-129227, May 9, 2000.*
Extended European Search Report Dated Feb. 25, 2008.
Communication from European Patent Office dated Jun. 22, 2009.

* cited by examiner

*Primary Examiner* — Callie E Shosho
*Assistant Examiner* — Anish Desai
(74) *Attorney, Agent, or Firm* — Sughrue Mion, PLLC

(57) ABSTRACT

The present invention relates to a self-rolling pressure-sensitive adhesive sheet, including a shrinkable film layer; a restriction layer disposed on a side of the shrinkable film layer; and a pressure-sensitive adhesive layer disposed on the side of the restriction layer which is opposite to the side on which the shrinkable film layer is disposed. The self-rolling pressure-sensitive adhesive sheet is a releasable pressure-sensitive adhesive sheet, in which the pressure-sensitive adhesive layer or the pressure-sensitive adhesive layer after an adhesiveness decreasing treatment has a pressure-sensitive adhesive power (180° C. peeling, against a silicon mirror wafer, tensile speed: 300 mm/min) of 6.5 N/10 mm or less, and in which the self-rolling pressure-sensitive adhesive sheet rolls up in one direction from an end to form one tubular roll or rolls up from two opposing ends toward a center of the two opposing ends to form two tubular rolls, when the self-rolling pressure-sensitive sheet is stimulated to induce the contraction of the shrinkable film layer.

9 Claims, 2 Drawing Sheets

SELF-ROLLING LAMINATED SHEET AND SELF-ROLLING PRESSURE-SENSITIVE ADHESIVE SHEET

FIELD OF THE INVENTION

The present invention relates to a self-rolling laminated sheet and a self-rolling pressure-sensitive adhesive sheet capable of spontaneously rolling up from an end, for example by heat, in a principal shrinking axis direction to form a tubular roll. The self-rolling pressure-sensitive adhesive sheet is useful, for example, as a releasable pressure-sensitive adhesive sheet such as a pressure-sensitive adhesive sheet for temporary wafer fixing or a pressure-sensitive adhesive sheet for wafer protection, to be employed in a working process of a semiconductor silicon wafer or the like. Furthermore, the self-rolling laminated sheet is useful, for example, as a supporting base material for a pressure-sensitive adhesive layer in the self-rolling pressure-sensitive adhesive sheet.

BACKGROUND OF THE INVENTION

Recently, in semiconductor materials, demands for thinner and lighter one are becoming stronger. In silicon wafers for semiconductor use, it is required to reduce the thickness to 100 μm or even less, but such a thin wafer is very brittle and easily cracked. Therefore, in wafer processing, a method of supporting the wafer on a temporary fixing pressure-sensitive adhesive sheet, and, after a necessary processing, releasing and recovering the wafer has been adopted.

Such temporary fixing pressure-sensitive adhesive sheet generally includes an energy ray-curable pressure-sensitive adhesive layer, and is employed in a method of adhering it to a wafer, then, after a processing such as grinding or dicing is applied to the temporarily fixed wafer, curing the pressure-sensitive adhesive layer by an irradiation with an energy ray and peeling off the pressure-sensitive adhesive layer with a lowered pressure-sensitive adhesive power from the wafer. However, the pressure sensitive adhesive sheet, of which the pressure-sensitive adhesive power is lowered by the irradiation with the energy ray, still sticks to the wafer surface by the atmospheric pressure. Therefore, in order to peel off the pressure-sensitive adhesive sheet from the wafer, there is required an operation, for example, of pulling off the pressure-sensitive adhesive sheet, but such operation is liable to cause troubles such as an edge chipping or a breakage of the wafer, for example, by a stress at the operation. Furthermore, when the thickness of the wafer is reduced after polishing (for example, when reduced to about 25 μm), the end edges of the pressure-sensitive adhesive sheet attached to the wafer may protrude further to the outside compared to the wafer edges. Thus, there is a risk that these protruding parts may adhere to the surface of a working table or to the part of dicing tape that is provided on the polished surface of the wafer, or the like, thus causing difficulties in peeling.

Japanese Patent No. 3073239 discloses a pressure-sensitive adhesive sheet including an energy ray-curable pressure-sensitive adhesive layer and a thermally shrinkable film in a layered structure. According to this pressure-sensitive adhesive sheet, as the heat-shrinkable sheet contracts at the irradiation with energy ray, an elongation or creases generated in the sheet, for example at irradiation with ultraviolet light, can be prevented. However, the peelability of the pressure-sensitive adhesive sheet from the wafer is still insufficient.

JP-A-2000-129227 discloses a pressure-sensitive adhesive sheet for protecting a semiconductor wafer, formed by a shrinkable film, a stiff film and an energy ray-curable pressure-sensitive adhesive layer. According to this pressure-sensitive adhesive sheet, the adhesive power of the pressure-sensitive adhesive layer is lowered by an irradiation with an energy ray and the shrinkable film is made to contract by required means, thereby causing a deformation in the pressure-sensitive adhesive sheet and reducing the contact area between the wafer and the pressure-sensitive adhesive layer, so that the pressure-sensitive adhesive sheet can be easily peeled off from the wafer. However, as the inventors of the invention selected arbitrary materials and examined similar ones, the inventors found that since the contraction of a shrinkable film occurring in multiple directions causes irregular deformation of the pressure-sensitive adhesive sheet after heating such that the pressure-sensitive adhesive sheet is folded and overlaps on the wafer surface, difficulties in peeling or adherend failure may occur. Generally, even a uniaxially shrinkable film available commercially causes a subsidiary contraction (one or plural contractions with relative weak shrinking power) in an axial direction different from the main shrinking axial direction due to a residual stress at the manufacture or due to a stress or a thermal strain applied to the pressure-sensitive adhesive sheet in the course of manufacture, and the contraction occurs as a combination of these.

When the area of the adherend is small, the deformation of the pressure-sensitive adhesive sheet caused by such subsidiary shrinkage is small, so that the detriments at the peeling tend to occur less. However, with an increase in the dimension of the adherend, the subsidiary contraction also increases and may eventually hinder the contraction in the direction of the principal shrinking axis. Particularly, in a pressure-sensitive adhesive sheet having a dimension widely used for a wafer, such inhibition of contraction in the direction of principal shrinking as is liable to occur, thus leading to troubles such as an incomplete peeling in which a part of the pressure-sensitive adhesive sheet remains adhered to the wafer after the peeling, a breakage in the adherend by an uneven stress at the contraction, and a contamination on the wafer by the pressure-sensitive adhesive cured and dropping from the pressure-sensitive adhesive sheet. It was also found that in the bilayer constitution of the substrate and the pressure-sensitive adhesive, the warpage generated after polishing the wafer was so large that conveyability and the like were very poor.

Patent Reference 1: Japanese Patent No. 3073239
Patent Reference 2: JP-A-2000-129227

SUMMARY OF THE INVENTION

An object of the present invention is to provide a pressure-sensitive adhesive sheet that can be very easily peeled off from an adherend without causing a damage or a contamination on the adherend, even when it is adhered to an adherend of a relatively low strength.

Another object of the present invention is to provide a laminated sheet, useful as a supporting base material of the pressure-sensitive adhesive sheet having the aforementioned satisfactory characteristics.

It is still another object of the invention to provide a pressure-sensitive adhesive sheet capable of suppressing warpage of a wafer generated by wafer polishing as much as possible when used as a pressure-sensitive adhesive sheet for temporary wafer fixing, and a laminated sheet which is useful as a supporting substrate of the pressure-sensitive adhesive sheet.

The present inventors thought that in order to achieve the objects described above, a pressure-sensitive adhesive sheet imparted with a function of easy peelability is needed. When an operation of peeling a pressure-sensitive adhesive sheet from an adherend is performed manually, first, in order to provide a peel starting point, tape is picked up at an edge portion of the adherend, and then the tape is pulled to peel off. However, with a fragile adherend, tape is not picked up, but the tape is rubbed, that is, the peeling angle is made maximal to diminish the peel stress to the minimum. Thus, in many cases, the peel starting point is provided so that the peel stress is minimized in order not to damage the adherend by rendering the peel angle as large as possible. Even after that, the tape is peeled off so that a peel angle is maintained as large as possible, and thereby it is possible to peel off the pressure-sensitive adhesive sheet from a fragile adherend.

Thus, the present inventors conceived that when imparting easy peelability under the stimulation of heat or the like, if the shape of the tape upon peeling can be deformed as if a carpet is rolled up (hereinafter, a body thus deformed is referred to as "tubular roll"), an pressure-sensitive adhesive tape which suits the purpose can be obtained. The reason is because peeling while inducing such deformation is corresponding to maintaining the peel angle as large as possible during the peeling, and to keeping the peel stress against the adherend as small as possible. That is, it implies that the possibility of damaging a fragile adherend can be minimized. Further, small peel stress may also decrease the possibility of contaminating the adherend by peeling, since the possibility of the pressure-sensitive adhesive being transferred onto the adherend by peeling is also decreased. Also, even when the pressure-sensitive adhesive adhered to the member on the polished surface side of the wafer, since the peel stress can be minimized, the risk of damaging the wafer is diminished.

Thus, the material examination has been carried out to realize the formation of a tubular roll by thermal stimulation. As a result, it was found that when a shrinkable film layer which is contractible, preferably by 30% or more, in at least one direction under thermal stimulation is provided, and a restriction layer which restricts contraction of the shrinkable film layer is laminated thereon, more preferably the restriction layer being composed of a laminate of an elastic layer and a stiff film layer, and each layer having predetermined properties, upon imparting a stimulation such as heat or the like, a contractive force of the shrinkable film and a repulsive force in the restriction layer against the contractive force of the shrinkable film become the driving force to lift up the external edge portion (end portion), whereby the laminated sheet spontaneously rolls up with the shrinkable film layer being inside, either in one direction from the end portion or from two opposing end portions toward the center (the center of the two end portions), thus forming one or two tubular rolls.

Furthermore, it was also found that when a releasable pressure-sensitive adhesive sheet having a pressure-sensitive adhesive layer provided on the restriction layer side of such laminated sheet, is attached to an adherend, and a stimulation such as heat or the like for accelerating the contraction of the shrinkable film layer is given upon the loss of adhesiveness by the pressure-sensitive adhesive layer during release after the laminated sheet has completed a predetermined role such as fixation, protection or the like of the adherend, the external edge portion (end portion) is likewise lifted up, whereby the laminated sheet runs in the horizontal direction while spontaneously rolling up, with the shrinkable film layer being inside, either in one direction from the end portion or from two opposing end portions toward the center (the center of the two end portions), thus forming one or two tubular rolls, and that the pressure-sensitive adhesive sheet can be very easily and cleanly peeled off from the adherend, without the adherend being damaged by the stress upon peeling. It was also found that this configuration significantly reduces contamination of the adherend due to peeling. The invention has been completed by repeatedly conducting research on the basis of these findings.

BRIEF DESCRIPTION OF THE DRAWINGS

FIGS. 3A to 3D are views (perspective views) illustrating a mode of spontaneous rolling of the self-rolling laminated sheet or pressure-sensitive adhesive sheet of the present invention wherein FIG. 3A is a view illustrating the self-rolling laminated sheet or pressure-sensitive adhesive sheet prior to the provision of stimulus inducing the contraction of the shrinkable film; FIG. 3B is a view illustrating a state where the self-rolling laminated sheet or pressure-sensitive adhesive sheet, subjected to the provision of stimulus inducing the contraction of the shrinkable film layer (pressure-sensitive adhesive sheet after the pressure-sensitive adhesive power of the pressure-sensitive adhesive layer is lowered or lost), starts to roll up from an external edge portion in one direction (normally along the principal shrinking axis of the shrinkable film); FIG. 3C is a view illustrating a state where the rolling of the sheet is completed and one tubular roll is formed (one-directional rolling); and FIG. 3D is a view illustrating a state where the sheet spontaneously rolls up from the two opposing ends toward the center (normally along the principal shrinking axis of the shrinkable film) thereby forming two tubular rolls (two-directional rolling).

Figure 1:
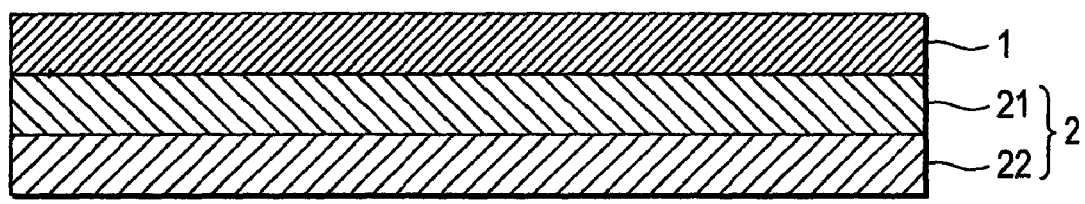
FIG. 1 is a schematic cross-sectional view illustrating an example of the self-rolling laminated sheet of the present invention.

DESCRIPTION OF SYMBOLS 1 shrinkable film layer
2 restriction layer
21 elastic layer
22 stiff film layer
3 pressure-sensitive adhesive layer

DETAILED DESCRIPTION OF THE INVENTION

Namely, the present invention relates to the following.
(1) A self-rolling laminated sheet, comprising:
a shrinkable film layer which is contractible in at least one axial direction; and
a restriction layer which restricts a contraction of the shrinkable film layer, the restriction layer being disposed on a side of the shrinkable film layer,
wherein the self-rolling laminated sheet rolls up in one direction from an end to form a tubular roll or rolls up from two opposing ends toward a center of the two opposing ends to form two tubular rolls, when the self-rolling laminated sheet is stimulated to induce the contraction of the shrinkable film layer.

(2) The self-rolling laminated sheet according to (1), wherein the shrinkable film layer comprises a thermally shrinkable film having a thermal shrinkage rate in a principal shrinking direction of from 30 to 90% at a temperature within a range of from 70 to 180° C.

(3) The self-rolling laminated sheet according to (1), wherein the restriction layer comprises an elastic layer on the shrinkable film layer side and a stiff film layer on the side opposite to the shrinkable film layer side.

(4) The self-rolling laminated sheet according to (3), wherein the elastic layer has a product of a shear modulus at 80° C. and a thickness within a range of from 1 to 1000 N/m.

(5) The self-rolling laminated sheet according to (3), wherein the stiff film layer has a product of a Young's modulus at 80° C. and a thickness within a range of $3.0 \times 10^5$ N/m or less.

(6) The self-rolling laminated sheet according to (3), wherein the elastic layer is formed by a crosslinking type acrylic pressure-sensitive adhesive.

(7) The self-rolling laminated sheet according to (1), wherein, when the self rolling laminated sheet rolls up after the stimulation to the self-rolling laminated sheet inducing the contraction of the shrinkable film layer to thereby form a tubular roll, the formed tubular roll has a ratio (r/L) within a range of from 0.001 to 0.333, wherein r is a diameter of the tubular roll and L is a length of the self-rolling laminated sheet in a rolling direction.

(8) The self-rolling laminated sheet according to (1), wherein, when the self-rolling laminated sheet rolls up after the stimulation to the self-rolling laminated sheet inducing the contraction of the shrinkable film layer to thereby form two tubular rolls, the formed tubular rolls each has a ratio (r/L) within a range of from 0.001 to 0.333, wherein r is a diameter of the tubular roll and L is a length of the self-rolling laminated sheet in a rolling direction.

(9) A self-rolling pressure-sensitive adhesive sheet, comprising:
 a shrinkable film layer which is contractible in at least one axial direction;
 a restriction layer which restricts a contraction of the shrinkable film layer, said restriction layer being disposed on a side of the shrinkable film layer; and
 a pressure-sensitive adhesive layer disposed on the side of the restriction layer which is opposite to the side on which the shrinkable film layer is disposed,
 said self-rolling pressure-sensitive adhesive sheet being a releasable pressure-sensitive adhesive sheet,
 wherein the pressure-sensitive adhesive layer or the pressure-sensitive adhesive layer after an adhesiveness decreasing treatment has a pressure-sensitive adhesive power (180° peeling, against a silicon mirror wafer, tensile speed: 300 mm/min) of 6.5 N/10 mm or less, and
 wherein the self-rolling pressure-sensitive adhesive sheet rolls up in one direction from an end to form one tubular roll or rolls up from two opposing ends toward a center of the two opposing ends to form two tubular rolls, when the self-rolling pressure-sensitive sheet is stimulated to induce the contraction of the shrinkable film layer.

(10) The self-rolling pressure-sensitive adhesive sheet according to (9), wherein the shrinkable film layer comprises a thermally shrinkable film having a thermal shrinkage rate in a principal shrinking direction of from 30 to 90% at a temperature within a range of from 70 to 180° C.

(11) The self-rolling pressure-sensitive adhesive sheet according to (9), wherein the restriction layer comprises an elastic layer on the shrinkable film layer side and a stiff film layer on the side opposite to the shrinkable film layer side.

(12) The self-rolling pressure-sensitive adhesive sheet according to (11), wherein the elastic layer has a product of a shear modulus at 80° C. and a thickness within a range of from 1 to 1000 N/m.

(13) The self-rolling pressure-sensitive adhesive sheet according to (11), wherein the stiff film layer has a product of a Young's modulus at 80° C. and a thickness within a range of from $3.0 \times 10^5$ N/m or less.

(14) The self-rolling pressure-sensitive adhesive sheet according to (11), wherein the elastic layer is formed by a crosslinking type acrylic pressure-sensitive adhesive.

(15) The self-rolling pressure-sensitive adhesive sheet according to (9), wherein the pressure-sensitive adhesive layer is formed by an energy ray-curable pressure-sensitive adhesive.

(16) The self-rolling pressure-sensitive adhesive sheet according to (9), wherein, when the self-rolling pressure-sensitive adhesive sheet rolls up after the stimulation to the self-rolling pressure-sensitive adhesive sheet inducing the contraction of the shrinkable film layer to thereby form a tubular roll, the formed tubular roll has a ratio (r/L) within a range of from 0.001 to 0.3333, wherein r is a diameter of the tubular roll and L is a length of the self-rolling pressure-sensitive adhesive sheet in a rolling direction.

(17) The self-rolling pressure-sensitive adhesive sheet according to (9), wherein, when the self-rolling pressure-sensitive adhesive sheet rolls up after the stimulation to the self-rolling pressure-sensitive adhesive sheet inducing the contraction of the shrinkable film layer to thereby form two tubular rolls, the tubular rolls each has a ratio (r/L) within a range of from 0.001 to 0.333, wherein r is a diameter of the tubular roll and L is a length of the self-rolling pressure-sensitive adhesive sheet in a rolling direction.

(18) A method for processing an article, which comprises:
 adhering the self-rolling pressure-sensitive adhesive sheet according to (9) to an article to temporarily fix the article, followed by processing the article;
 lowering the pressure-sensitive adhesive power of said pressure-sensitive adhesive sheet and providing a stimulus inducing the contraction of the shrinkable film layer to said pressure-sensitive adhesive sheet, thereby causing said pressure-sensitive adhesive sheet to spontaneously roll up either in one direction from an end to form a tubular roll or from the two opposing ends toward a center of the two opposing ends to form two tubular rolls and to be thus peeled off from the article; and
 obtaining a completed article.

The self-rolling pressure-sensitive adhesive sheet and laminated sheet according to the invention roll identically, even when the length L of the sheet in the rolling direction is increased. Therefore, the lower limit of r/L becomes smaller as the length L of the sheet in the rolling direction increases.

In the present specification, the shrinkage rate (%) means a value calculated by the equation.

$$[(\text{dimension before shrinkage}-\text{dimension after shrinkage})/(\text{dimension before shrinkage})] \times 100$$

In this regard, it indicates the shrinkage rate in the principal shrinking axis unless specified otherwise.

The self-rolling pressure-sensitive adhesive sheet of the present invention, after an adherend temporarily fixed by adhesion is subjected to a predetermined processing, is urged by a stimulus such as heat which induces contraction, and spontaneously rolls up, normally along the direction of a principal shrinking axis from an end portion (one end portion or opposed two end portions), under peeling from the adherend to form a tubular roll, so that it can be extremely easily removed from the surface of the adherend without a damage to the adherend or a contamination thereon by an incomplete peeling. It is therefore useful as a releasable pressure-sensitive adhesive sheet to be adhered particularly on a fragile adherend. Additionally, the self-rolling laminated sheet of the present invention, when it is given a stimulus inducing a contraction, spontaneously rolls up normally in the direction of a principal shrinking axis from an end portion (one end portion or two opposed end portions) to form a tubular roll, so that it can be advantageously utilized as a supporting base material for the pressure-sensitive adhesive layer in the aforementioned self-rolling pressure-sensitive adhesive sheet.

In the present specification, "self-rolling property" means a property that an object having such a property spontaneously rolls up due to the application of a stimulus inducing a contraction, such as heat, light and electric stimulus.

"Self-rolling laminated sheet" is a laminated sheet having a self-rolling property. When a stimulus inducing a contraction is applied to the self-rolling laminated sheet, it spontaneously rolls up either in one direction from an end or from two opposing ends toward a center of the two opposing ends to form one or two tubular rolls.

"Self-rolling pressure-sensitive adhesive sheet" is a pressure-sensitive adhesive sheet having a self-rolling property, and it includes a self-rolling laminated sheet and a pressure-sensitive adhesive layer disposed on a surface of a restriction layer constituting the self-rolling laminated sheet. When the pressure-sensitive adhesive power of the self-rolling pressure-sensitive adhesive sheet is lowered or lost and a stimulus inducing a contraction is applied to the self-rolling pressure-sensitive adhesive sheet, it spontaneously rolls up either in one direction from an end or from two opposing ends toward a center of the two opposing ends to form one or two tubular rolls.

Figure 2:
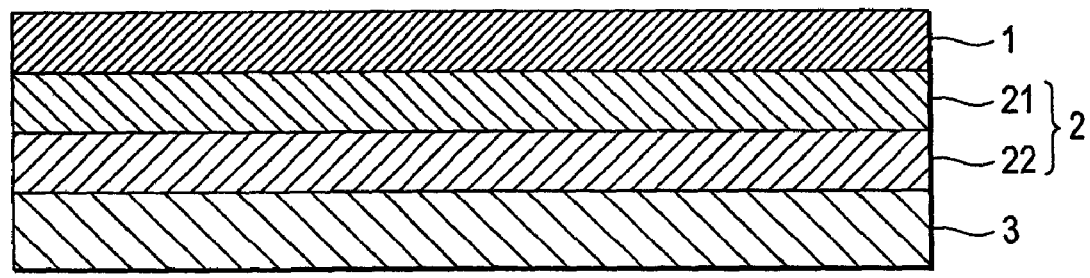
FIG. 2 is a schematic cross-sectional view illustrating an example of the self rolling pressure-sensitive adhesive sheet of the present invention.

In the following, embodiments of the present invention will be described with reference to the accompanying drawings. FIG. 1 is a schematic cross-sectional view illustrating an example of the self-rolling laminated sheet of the invention. FIG. 2 is a schematic cross-sectional view illustrating an example of the self-rolling pressure-sensitive adhesive sheet. The self-rolling laminated sheet illustrated in FIG. 1 is a laminated member including a shrinkable film layer 1 having a uniaxial shrinking property and a restriction layer 2 for restricting the contraction of the shrinkable film layer 1. The restriction layer 2 is constituted of an elastic layer 21 on the shrinkable film layer 1 side and a stiff film layer 22 on the side opposite to the shrinkable film layer 1 side. Further, the pressure-sensitive adhesive sheet illustrated in FIG. 2 is a laminated member, formed by laminating a pressure-sensitive adhesive layer 3 on the side of the stiff film layer 22 of the self-rolling laminated sheet illustrated in FIG. 1. In this case, the self-rolling laminated sheet functions as a supporting base material for the self-rolling pressure-sensitive adhesive sheet.

The shrinkable film layer 1 may be a film layer which is contractible in at least one axial direction, and may be any of a thermally shrinkable film, a film showing shrinking property by light, and a film shrinking by an electric stimulus. Among these, it is preferred that the shrinkable film layer 1 is a thermally shrinkable film from a viewpoint of operability. The shrinkable film layer 1 may have the shrinking property in one axial direction only, or may have a principal shrinking property in a certain direction (one axial direction) and a subsidiary shrinking property in another direction (for example, a direction perpendicular to the above-mentioned direction). The shrinkable film layer 1 may be constructed as a single layer, or a composite layer formed by two or more layers.

The shrinkable film constituting the shrinkable film layer 1 preferably has a shrinking rate in the principal shrinking direction of from 30 to 90%. In the case that the shrinkable film layer 1 is formed by a thermally shrinkable film, such thermally shrinkable film preferably has a shrinking rate in the principal shrinking direction of from 30 to 90%, at a predetermined temperature within a range of from 70 to 180° C. (for example, 95° C., 140° C., etc.). In the shrinkable film constituting the shrinkable film layer 1, a shrinking rate in a direction other than the principal shrinking direction is preferably 10% or less, more preferably 5% or less and particularly preferably 3% or less. The thermal shrinking property of a thermally shrinkable film can be provided, for example, by applying a stretching process to a film extruded by the extruder.

Examples of the thermally shrinkable film include uniaxially stretched films, prepared from one or more resins selected, for example, from polyester such as polyethylene terephthalate, polyolefin such as polyethylene or polypropylene, polynorbornene, polyimide, polyamide, polyurethane, polystyrene, polyvinylidene chloride and polyvinyl chloride. Among these, owing to satisfactory coating operability for pressure-sensitive adhesive, preferred is a uniaxially stretched film formed by a polyester resin, a polyolefin resin (including cyclic polyolefin resin) such as polyethylene, polypropylene or polynorbornene, or a polyurethane resin. As such thermally shrinkable film, commercial products such as Space Clean manufactured by Toyobo Co., Fancy Wrap manufactured by Gunze Ltd., Torayfan manufactured by Toray Industries Ltd., Lumirror manufactured by Toray Industries Ltd., Arton manufactured by JSR Corp., and Zeonore manufacture by Nippon Zeon Co. may be employed.

In the case of utilizing the self-rolling laminated sheet as the supporting base material for the energy ray-curable pressure-sensitive adhesive sheet, and when the irradiation with an energy ray is executed through the thermally shrinkable film layer 1 for curing the energy ray-curable pressure-sensitive adhesive layer, the thermally shrinkable film layer 1 should be constructed with a material capable of transmitting the energy ray of a predetermined amount or larger (for example, a resin having transparency).

The thermally shrinkable film layer 1 has a thickness of normally from 5 to 300 μm, preferably from 10 to 100 μm. An excessively large thickness of the thermally shrinkable film layer 1 increases the stiffness, whereby the spontaneous rolling does not occur but the separation takes place between the thermally shrinkable film layer 1 and the restriction layer 2, thus possibly leading to the destruction of the laminated member. Furthermore, it is known that a film having high hardness has high elastic stress which is caused by residual stress occurring upon tape bonding, and thus warpage is likely to be enlarged when the wafer is made thin. The surface of the thermally shrinkable film layer 1 may be subjected, in order to improve the adhesiveness to and the holding property for the adjacent layer, to ordinary surface treatment, for example, a chemical or physical treatment such as a treatment with chromic acid, an exposure to ozone, an exposure to flame, an exposure to a high voltage electric spark, a treatment with an ionizing radiation, or a coating with an undercoating material (such as a pressure-sensitive adhesive substance).

The restriction layer 2 restricts the contraction of the shrinkable film layer 1 to induce a reactive force, which becomes in turn a driving force to cause rolling by generating a force couple in the entire laminate. Furthermore, it is considered that the restriction layer 2 suppresses a subsidiary contraction of the shrinkable film layer 1 in a direction different from the principal shrinking direction thereof, whereby the shrinking direction of the shrinkable film layer 1, which is not necessarily unique even when it is called a uniaxially shrinkable film, converges to one direction. Therefore, when the laminated film is given a stimulus inducing the contraction of the shrinkable film layer 1, a repulsive force in the restriction layer 2 against the contractive force of the shrinkable film layer 1 is considered to function as a driving force to lift up an external edge portion (one end or two opposing ends) of the laminated sheet, whereby the laminated sheet spontaneously rolls up, with the shrinkable film layer 1 at the inside, either in one direction or in directions toward the center (normally in the direction of the principal shrinking axis of the thermally shrinkable film) to form the tubular roll. Further, the restriction layer 2 serves to prevent a shearing force, generated by the shrinkage deformation of the shrinkable film layer 1, from being transmitted to the pressure-sensitive adhesive layer 3 or the adherend, thereby avoiding a breakage of the pressure-sensitive adhesive layer having a lowered pressure-sensitive adhesive power at the releasing (for example, a cured pressure-sensitive adhesive layer), a breakage in the adherend or a contamination of the adherend by the broken pressure-sensitive adhesive layer.

The restriction layer 2, in order to exhibit a function of restricting the contraction of the shrinkable film layer 1, has an elasticity and an adhesive property (including pressure-sensitive adhesive property) to the shrinkable film layer 1. Further, in order to form the tubular roll smoothly, the restriction layer 2 preferably has certain toughness or stiffness. The restriction layer 2 may be constructed with a single layer, or constituted of plural layers in which the functions are shared by plural layers.

In the examples illustrated in FIGS. 1 and 2, the restriction layer 2 is constituted of an elastic layer 21 and a stiff film layer 22, The elastic layer 21 is preferably easily deformable, namely in a rubber-like state, at the temperature of contraction of the shrinkable film layer 1 (at the temperature of peeling of the pressure-sensitive adhesive sheet when the self-rolling laminated sheet is employed as the supporting base material of the self-rolling pressure-sensitive adhesive sheet). However, in a material having fluidity, a sufficient reactive force is not generated, and eventually the shrinkable film contracts by itself, thus being unable to cause deformation (spontaneous rolling). Therefore, the elastic layer 21 preferably has a fluidity suppressed, for example, by a three-dimensional crosslinking. Additionally, the elastic layer 21, also by a thickness thereof, exerts a function of resisting to a weaker force component within the non-uniform shrinking power of the shrinkable film layer 1 to prevent a shrinkage deformation by such weaker force component, thereby achieving a conversion into a unique shrinking direction. It is conceived that the warpage formed after wafer polishing is induced when the stress occurring upon bonding the pressure-sensitive adhesive sheet to the wafer remains behind, and this residual stress causes elastic deformation of the shrinkable film. However, the elastic layer also has a function of relieving this residual stress to reduce warpage.

Therefore, the elastic layer 21 is desirably formed by a resin having a pressure-sensitive adhesive property and having a glass transition temperature, for example, of 50° C. or lower, preferably a room temperature (25° C.) or lower and more preferably 0° C. or lower. The pressure-sensitive adhesive power of the elastic layer 21 on the side of the shrinkable film layer 1 is, as a value obtained by a 180° peeling test (according to JIS Z 0237, tensile speed: 300 mm/min, 50° C.), preferably 0.5 N/10 mm or higher. An excessively low pressure-sensitive adhesive power is liable to cause a peeling between the thermally shrinkable film layer 1 and the elastic layer 21.

Furthermore, the shear modulus G of the elastic layer 21 is preferably from $1 \times 10^4$ Pa to $5 \times 10^6$ Pa (particularly, $0.05 \times 10^6$ Pa to $3 \times 10^6$ Pa) at a temperature ranging from room temperature to the temperature upon peeling (for example, 80° C.). When the shear modulus is too small, the effect of converting the contractive stress of the shrinkable film layer to the stress required in rolling becomes insufficient, On the other hand, when the shear modulus is too large, in addition to the point that rollability becomes insufficient so as to enhance hardness, it is likely to have difficulties in the production of a laminate because those having high elasticity in general have insufficient adhesiveness, or the function of relieving the residual stress also becomes deteriorated. The thickness of the elastic layer 21 is preferably about 15 to 150 µm. When the thickness is too small, it is difficult to obtain the property of restriction against the contraction of the shrinkable film layer 1, and the effect of stress relief is also decreased. On the contrary, when the thickness is too large, the property of spontaneous rolling is deteriorated, and the handlability and economic efficiency are also decreased, which is undesirable. Accordingly, a product of the shear modulus G (for example, the value at 80° C.) and the thickness (shear modulus G×thickness) of the elastic layer 21 is preferably 1 to 1000 N/m, more preferably 1 to 150 N/m, and even more preferably 1.2 to 100 N/m.

Further, in the case that the pressure-sensitive adhesive layer 3 is formed by an energy ray-curable pressure-sensitive adhesive layer, it is preferable that the elastic layer 21 is formed by a material capable of easily transmitting the energy ray and has a satisfactory moldability for obtaining a film with an appropriately selectable thickness, in consideration of the manufacturing property and the operating efficiency.

As the elastic layer 21, employable for example is a resin film (including sheet) of a foamed material (foamed film) such as urethane foam or acryl foam or a non-foamed resin film of rubber or a thermoplastic elastomer, subjected to a pressure-sensitive adhesive treatment on the surface (at least a surface on the shrinkable film layer 1 side). The pressure-sensitive adhesive to be employed in the pressure-sensitive adhesive treatment is not particularly restricted, and may be one of or a combination of two or more of publicly known pressure-sensitive adhesives such as acrylic pressure-sensitive adhesives, rubber type pressure-sensitive adhesives, vinyl alkyl ether pressure-sensitive adhesives, silicone pressure-sensitive adhesives, polyester pressure-sensitive adhesives, polyamide pressure-sensitive adhesives, urethane pressure-sensitive adhesives, and styrene-diene block copolymer type pressure-sensitive adhesives. In particular, acrylic pressure-sensitive adhesives may be employed advantageously, for example in consideration of adjustment of the pressure-sensitive adhesive power. In this regard, the resin of the pressure-sensitive adhesive to be employed for the pressure-sensitive adhesive treatment and the resin of the foamed film or the non-foamed resin film are preferably those of a same type, in order to obtain a high affinity. For example, in a case of employing an acrylic pressure-sensitive adhesive for the pressure-sensitive adhesive treatment, an acryl foam may be employed advantageously as the resin film.

Further, the elastic layer 21 may be formed by a resinous composition having an adhesive property in itself, such as a crosslinking type acrylic pressure-sensitive adhesive. The layer (pressure-sensitive adhesive layer) formed by such crosslinking type acrylic pressure-sensitive adhesive or the like can be produced by a relatively simple method, without requiring a separate pressure-sensitive adhesive treatment, and is employed advantageously because of excellent productivity and economical property.

The crosslinking type acrylic pressure-sensitive adhesive has a composition in which a crosslinking agent is added to an acrylic pressure-sensitive adhesive containing an acrylic polymer as a base polymer. Examples of the acrylic polymer include homopolymers or copolymers of a (meth)acrylic acid alkyl ester, for example (meth)acrylic acid $C_1$-$C_{20}$ alkyl ester such as methyl (meth)acrylate, ethyl (meth)acrylate, butyl (meth)acrylate, 2-ethylhexyl (meth)acrylate, and octyl (meth)acrylate; and copolymers of the above-described (meth)acrylic acid alkyl ester and another copolymerizable monomer including a carboxyl group-containing or acid anhydride group-containing monomer such as acrylic acid, methacrylic acid, itaconic acid, fumaric acid or maleic anhydride; a hydroxyl group-containing monomer such as 2-hydroxyethyl (meth)acrylate; an amino group-containing monomer such as morpholyl (meth)acrylate; an amide group-containing monomer such as (meth)acrylamide; a cyano group-containing monomer such as (meth)acrylonitrile; or a (meth)acrylic acid ester having an alicyclic hydrocarbon group such as isobornyl (meth)acrylate.

As the acrylic polymer, particularly preferred is a copolymer of one or more of (meth)acrylic acid $C_1$-$C_{12}$ alkyl esters such as ethyl acrylate, butyl acrylate or 2-ethylhexyl acrylate, and at least a copolymerizable monomer selected from hydroxyl group-containing monomers such as 2-hydroxyethyl actylate and a carboxyl group-containing or acid anhydride group-containing monomer such as acrylic acid, or a copolymer of one or more of (meth)acrylic acid $C_1$-$C_{12}$ alkyl esters, a (meth)acrylic acid ester having an alicyclic hydrocarbon group, and at least a copolymerizable monomer selected from hydroxyl group-containing monomers and carboxyl group-containing or acid anhydride group-containing monomers.

The acrylic polymer is, for example, prepared by photopolymerizing (for example, with an ultraviolet light) the monomer components described above (and polymerization initiator) in the absence of solvent, as a liquid prepolymer of a high viscosity. The crosslinking type pressure-sensitive adhesive composition can be obtained by adding a crosslinking agent to the prepolymer. The crosslinking agent may be added at the preparation of the prepolymer. The crosslinking type acrylic pressure-sensitive adhesive composition may also be obtained by adding, to an acrylic polymer obtained by polymerizing the monomer components described above or a solution thereof, a crosslinking agent and a solvent (not essential in a case of utilizing the solution of the acrylic polymer).

The crosslinking agent is not particularly restricted, and, for example, an isocyanate type crosslinking agent, a melamine type crosslinking agent, an epoxy type crosslinking agent, an acrylate type crosslinking agent (polyfunctional acrylate), or a (meth)acrylic acid ester having an isocyanate group may be used for this purpose. Examples of the acrylate type crosslinking agent include hexanediol diacrylate, 1,4-butanediol diacrylate, trimethylolpropane triacrylate, pentaerythritol tetraacrylate, and dipentaerythritol hexaactylate. Examples of (meth)acrylic acid ester having an isocyanate group include 2-isocyanatethyl acrylate and 2-isocyanatethyl methacrylate. Among these, an ultraviolet (UV) reactive crosslinking agent such as an acrylate type crosslinking agent (polyfunctional acrylate) or a (meth)acrylic acid ester having an isocyanate group are preferable. The crosslinking agent is normally employed in an amount of from 0.01 to 15 parts by weight, preferably from 0.05 to 12 parts by weight, with respect to 100 parts by weight of the base polymer.

The crosslinking type acrylic pressure-sensitive adhesive may contain, in addition to the base polymer and the crosslinking agent, appropriate additives such as a crosslinking promoter, a tackifier resin (such as a rosin derivative resin, a polyterpene resin, a petroleum resin, or an oil-soluble phenolic resin), a viscosifier, a plasticizer, a filler, an aging resistor, and an antioxidant.

The crosslinking type acrylic pressure-sensitive adhesive layer, serving as the elastic layer 21, can be obtained simply by forming the crosslinking type acrylic pressure-sensitive adhesive composition, prepared by adding the crosslinking agent to the prepolymer, into a film of desired thickness and area by a publicly known method such as a casting method and irradiating it with light again to cause a crosslinking reaction (and polymerization of unreacted monomers), thereby attaining the desired performance. Thus obtained elastic layer (crosslinking type acrylic pressure-sensitive adhesive layer), having a self-pressure-sensitive adhesive property, can be used by directly adhering between the shrinkable film layer 1 and the stiff film layer 22. As the crosslinking type acrylic pressure-sensitive adhesive layer, usable also is a commercial double-faced adhesive tape such as HJ-9150W (trade name), manufactured by Nitto Denko Corporation. Also, the crosslinking reaction may be executed, after a film-shaped pressure-sensitive adhesive is adhered between the shrinkable film layer 1 and the stiff film layer 22, by executing a light irradiation again.

The crosslinking type acrylic pressure-sensitive adhesive layer, serving as the elastic layer 21, may also be obtained by coating a crosslinking type acrylic pressure-sensitive adhesive composition, prepared by dissolving the acrylic polymer above and the crosslinking agent in a solvent, on the surface of the stiff film layer 22, then adhering the shrinkable film layer 1 thereon and executing a light irradiation. In the case where the pressure-sensitive adhesive layer 3 is an energy ray-curable pressure-sensitive adhesive layer, the crosslinking type acrylic pressure-sensitive adhesive described above may be cured (crosslinked) by irradiation with the energy ray (photoirradiation) used for curing the pressure-sensitive adhesive layer 3 upon releasing.

The elastic layer 21 in the present invention may further include beads such as glass beads or resin beads. Addition of glass beads or resin beads to the elastic layer 21 is advantageous in facilitating the control of the pressure-sensitive adhesive characteristics and the shear modulus. The beads have an average particle size, for example, of about from 1 to 100 μm, preferably from 1 to 20 μm. The beads are employed in an amount of from 0.1 to 10 parts by weight, preferably from 1 to 4 parts by weight, with respect to 100 parts by weight of the entire elastic layer 21. An excessively large amount of addition may deteriorate the pressure-sensitive adhesive characteristics, and an excessively small amount tends to provide only insufficient effects.

The stiff film layer 22 has a function of inducing a reactive force against the contractive force of the shrinkable film layer by imparting stiffness or toughness to the restriction layer 2, and further generating a force couple required in rolling. Presence of the stiff film layer 22 enables, when a stimulus such as heat for inducing the contraction is given to the shrinkable film layer 1, the laminated sheet or the pressure-sensitive adhesive sheet to smoothly execute a spontaneous rolling without an interim stopping or a displacement in the direction, thereby forming a tubular roll having a regulated shape.

Examples of the resin film constituting the stiff film layer 22 include a film formed by one or more resins selected from polyesters such as polyethylene terephthalate, polybutylene terephthalate and polyethylene naphthalate; polyolefins such as polyethylene or polypropylene; polyimides; polyamides; polyurethanes; styrenic resin such as polystyrene; polyvinylidene chloride; and polyvinyl chloride. Among these, polyester resin films, a polypropylene film and a polyamide film are preferred because of the satisfactory coating operability for the pressure-sensitive adhesive. The stiff film layer 22 may have a single layer, or a composite layer formed by two or more layers. The stiff film constituting the stiff film layer 22 is non-shrinkable, and has a shrinking rate, for example, of 5% or less, preferably 3% or less and more preferably 1% or less.

The product of Young's modulus and thickness (Young's modulus×thickness) of the stiff film layer 22 at the temperature of peeling (for example, 80° C.) is preferably $3.0 \times 10^5$ N/m or less (for example, $1.0 \times 10^2$ to $3.0 \times 10^5$ N/m), and more preferably $2.8 \times 10^5$ N/m or less (for example, $1.0 \times 10^3$ to $2.8 \times 10^5$ N/m). When the product of Young's modulus and thickness of the stiff film layer 22 is too small, the effect of converting the contractive stress of the shrinkable film layer to rolling stress is insufficient, and the directional contractive action also is likely to be deteriorated. On the contrary, when the product is too large, rolling is likely to be suppressed by the stiffness. Young's modulus of the stiff film layer 22 at the temperature of peeling (for example, 80° C.) is preferably $3 \times 10^6$ to $2 \times 10^{10}$ N/m$^2$, and more preferably $1 \times 10^8$ to $1 \times 10^{10}$ N/m. When the Young modulus is too small, it is difficult to obtain a tubular roll which is rolled with a proper shape. On the contrary, when the Young's modulus is too large, it is difficult to have spontaneous rolling. The thickness of the stiff film layer 22 is, for example, about 20 to 150 μm, preferably 25 to 95 μm, more preferably 30 to 90 μm, and particularly preferably 30 to 80 μm. When the thickness is too small, it is difficult to obtain a tubular roll which is rolled with a proper shape. When the thickness is too large, the self-rolling property is deteriorated, and handlability and economic efficiency are decreased, which is not desirable.

In the case that the pressure-sensitive adhesive layer 3 is formed by an energy ray-curable pressure-sensitive adhesive, it is preferable that the stiff film layer 22 is formed by a material capable of easily transmitting the energy ray and has a satisfactory moldability for obtaining a film with an appropriately selectable thickness, in consideration of the manufacturing property and the operating efficiency.

In the above-described embodiment, the restriction layer 2 is constituted of the elastic layer 21 and the stiff film layer 22, but such construction is not essential. For example, the stiff film layer 22 may be dispensed with by providing the elastic layer 21 with a suitable stiffness.

For the pressure-sensitive adhesive layer 3, a pressure-sensitive adhesive layer inherently having a small pressure-sensitive adhesive power may be used, but the pressure-sensitive adhesive layer is preferably a releasable pressure-sensitive adhesive layer which has an adhesiveness capable of adhering to an adherend, and is capable of having deteriorated adhesiveness or losing adhesiveness by any means (adhesiveness decreasing treatment) after a predetermined role is accomplished. Such releasable pressure-sensitive adhesive layer can be constituted in the same manner as in the pressure-sensitive adhesive layer of known releasable pressure-sensitive adhesive sheets. From the viewpoint of the self-rolling property, the pressure-sensitive adhesive power (180° peeling, against a silicon mirror wafer, tensile speed: 300 mm/min) of a pressure-sensitive adhesive layer or a pressure-sensitive adhesive layer after an adhesiveness decreasing treatment is, for example, preferably 6.5 N/10 mm or less (particularly 6.0 N/10 mm or less) at ambient temperature (25° C.).

The pressure-sensitive adhesive layer 3 is preferably an energy ray-curable pressure-sensitive adhesive layer. The energy ray-curable pressure-sensitive adhesive layer may be formed by a material which initially has a pressure-sensitive adhesive property and which forms a three-dimensional network structure by an irradiation with an energy ray such as an infrared light, a visible light, an ultraviolet light, an X-ray or an electron beam, thereby showing a high elasticity, and an energy ray-curable pressures sensitive adhesive can be utilized for such material. The energy ray-curable pressure-sensitive adhesive contains a compound chemically modified with an energy ray-reactive functional group for providing an energy ray-curable property, or an energy ray-curable compound (or an energy ray-curable resin). Therefore, the energy ray-curable pressure-sensitive adhesive is preferably formed by a base component which is chemically modified by an energy ray-reactive functional group, or a composition formed by blending an energy ray-curable compound (or energy ray-curable resin) with a base component.

As the base component, employable is a pressure-sensitive adhesive such as an already known pressure-sensitive adhesive (sticky adhesive). Examples of the pressure-sensitive adhesive include rubber-type pressure-sensitive adhesives utilizing, as a base polymer, a rubber-type polymer such as natural rubber, polyisobutylene rubber, styrene-butadiene rubber, styrene-isoprene-styrene block copolymer rubber, regenerated rubber, butyl rubber, polyisobutylene rubber or NBR; silicone type pressure-sensitive adhesives; and acrylic pressure-sensitive adhesives. Among these, acrylic pressure-sensitive adhesives are preferred. The base component may be formed by a single component or two or more components.

Examples of the acrylic pressure-sensitive adhesive include those utilizing, as the base polymer, homopolymers or copolymers of a (meth)acrylic acid alkyl ester, for example (meth)acrylic acid $C_1$-$C_{20}$ alkyl ester such as methyl (meth)acrylate, ethyl (meth)acrylate, butyl (meth)acrylate, 2-ethylhexyl (meth)acrylate, and octyl (meth)acrylate; and copolymers of such (meth)acrylic acid alkyl ester and another copolymerizable monomer (for example a carboxyl group-containing or acid anhydride group-containing monomer such as acrylic acid, methacrylic acid, itaconic acid, fumaric acid or maleic anhydride; a hydroxyl group-containing monomer such as 2-hydroxyethyl (meth)acrylate; an amino group-containing monomer such as morpholyl (meth)acrylate; or an amide group-containing monomer such as (meth)acrylamide). These materials may be employed singly or in a combination of two or more kinds.

The energy ray-reactive functional group to be employed for the chemical modification for energy ray curing of the energy ray-curable pressure-sensitive adhesive or the energy ray-curable compound is not particularly restricted so long as it is curable with an energy ray such as an infrared light, a visible light, an ultraviolet light, an X-ray or an electron beam, but it is preferably capable of an efficient three-dimensional network structuring (networking) in the energy ray-curable pressure-sensitive adhesive after the irradiation with the energy ray. These may be employed singly or in a combination of two or more kinds. Examples of the energy ray-reactive functional group to be employed for chemical modification include functional groups having a carbon-carbon multiple bond, such as an acryloyl group, a methacryloyl group, a vinyl group, an allyl group and an acetylene group. In such functional group, the carbon-carbon multiple bond is cleaved by an energy ray irradiation to generate a radical, which constitutes a crosslinking site to form a three-dimensional network structure. Among these, the (meth)acryloyl group is preferable in consideration of reactivity and operability, as it shows a relatively high reactivity to the energy ray and can be selected and used in combination from various acrylic pressure-sensitive adhesives.

Representative examples of the base component, chemically modified with an energy ray-reactive functional group, include polymers obtained by reacting a reactive functional group-containing acrylic polymer, which is obtained by copolymerizing a monomer including a reactive functional group such as a hydroxyl group or a carboxyl group (such as 2-hydroxyethyl (meth)acrylate or (meth)acrylic acid) with a (meth)acrylic acid alkyl ester, with a compound containing a group (such as an isocyanate group or an epoxy group) capable of reacting with the reactive functional group and an energy ray-reactive functional group (such as an acryloyl group or a methacryloyl group) within the molecule [such as (meth)acryloyloxy ethyleneisocyanate].

In the reactive functional group-containing acrylic polymer, the proportion of the monomer containing the reactive functional group is, for example, from 5 to 40 wt %, preferably from 10 to 30 wt % with respect to all the monomers. In the reaction with the reactive functional group-containing acrylic polymer, the amount of the compound which has the group capable of reacting with the reactive functional group and has the energy ray-reactive functional group within the molecule thereof is, for example, from 50 to 100 mol %, preferably from 60 to 95 mol %, with respect to the reactive functional groups (such as hydroxyl group and carboxyl group) in the reactive functional group-containing acrylic polymer.

Examples of the energy ray-curable compound include compounds having two or more carbon-carbon double bonds, such as trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butanediol diacrylate, 1,6-hexanediol diacrylate, and a compound containing a poly(meth)acryloyl group such as polyethyleneglycol diacrylate. These compounds may be employed singly or in a combination of two or more kinds. Among these, particularly preferable is a compound containing a poly(meth)acryloyl group, as disclosed in, for example, JP-A-2003-292916. Hereinafter, the compound containing poly(meth)acryloyl group may be referred as an "acrylate type crosslinking agent".

The energy ray-curable compound may also be a mixture of an organic salt such as an onium salt, and a compound having plural heterocycles within the molecule thereof. In such mixture, the organic salt is cleaved by the energy ray irradiation to generate an ion, which serves as an initiating species to induce a ring-opening reaction of the heterocycle, thereby forming a three-dimensional network structure. Examples of the organic salt include an iodonium salt, a phosphonium salt, an antimonium salt, a sulfonium salt and a borate salt, and examples of the heterocycle in the compound having plural heterocycles within the molecule include oxirane, oxetane, oxorane, thiirane and aziridine. More specifically, compounds described in Photocuring Technology (2000), Technical Information Institute Co., may be utilized.

Examples of the energy ray-curable resin include photosensitive group-containing polymers or oligomers, for example, an ester (meth)acrylate, an urethane (meth)acrylate, an epoxy (meth)acrylate, a melamine (meth)acrylate, and an acrylic resin (meth)acrylate, having a (meth)acryloyl group at a terminal end of the molecule, a thiol-ene addition type resin and a photocationic polymerized resin, having an allyl group at a terminal end of the molecule, a cinnamoyl group-containing polymer such as polyvinyl cinnamate, a diazotized amino-novolac resin and an acrylamide type polymer. Further, examples of the polymer reactive by a high energy ray include epoxylated polybutadiene, unsaturated polyester, polyglycidyl methacrylate, polyacrylamide, and polyvinylsiloxane. In a case of utilizing the energy ray-curable resin, the aforementioned base component is not essential.

The energy ray-curable pressure-sensitive adhesive is particularly preferably formed by a combination of the aforementioned acrylic polymer or the acrylic polymer chemically modified with an energy ray-reactive functional group (acrylic polymer in which an energy ray-reactive functional group is introduced in a side chain), and the aforementioned energy ray-curable compound (for example, a compound having two or more carbon-carbon double bonds). Such combination is preferable in reactivity and operation efficiency, as it contains the acrylate group showing a relatively high reactivity to the energy ray and it can be selected from various acrylic pressure-sensitive adhesives. Specific examples of such combination include a combination of an acrylic polymer in which an acrylate group is introduced into a side chain, and a compound which includes two or more functional groups containing a carbon-carbon double bond (particularly an acrylate group). Such combination may be those disclosed, for example, in JP-A-2003-292916.

The acrylic polymer in which an acrylate group is introduced into a side chain can be prepared, for example, by a method of bonding an isocyanate compound such as acryloyloxyethyl isocyanate or methacryloyloxyethyl isocyanate to a acrylic polymer having a hydroxyl group in a side chain, through an urethane bond.

The amount of the energy ray-curable compound is, with respect to 100 parts by weight of the base component (for example, the aforementioned acrylic polymer or the acrylic polymer chemically modified with an energy ray-reactive functional group), about from 0.5 to 200 parts by weight, preferably from 5 to 180 parts by weight and more preferably from 20 to 130 parts by weight.

In the energy ray-curable pressure-sensitive adhesive, an energy ray polymerization initiator for curing the compound, which provides the energy ray-curing property, may be blended in order to improve the reaction speed for forming the three-dimensional network structure.

The energy ray polymerization initiator may be selected from the publicly known or common polymerization initiators, according to the type of the employed energy ray (for example infrared light, visible light, ultraviolet light, X-ray or electron beam). In consideration of the operation efficiency, a compound capable of initiating a photopolymerization by an ultraviolet light is preferable. Examples of the representative energy ray polymerization initiator include ketone type initiators such as benzophenone, acetophenone, quinone, naphthoquinone, anthraquinone and fluorenone; azo type initiators such as azobisisobutyronitrile; and peroxide type initiators such as benzoyl peroxide and perbenzoic acid, but these examples are not exhaustive. Commercial products thereof include, for example, Irgacure 184 and Irgacure 651 (trade names) manufactured by Ciba-Geigy Ltd.

The energy ray polymerization initiator may be employed singly or in a combination of two or more kinds. The energy ray polymerization initiator is employed in an amount of about from 0.01 to 10 parts by weight, preferably about from 1 to 8 parts by weight, with respect to 100 parts by weight of the base component. According to the necessity, an energy ray polymerization promoter may be used in combination with the energy ray polymerization initiator.

In the energy ray-curable pressure-sensitive adhesive, in addition to the components described above, appropriate additives may be optionally added, such as a crosslinking agent, a curing (crosslinking) promoter a tackifier, a vulcanizing agent, and a viscosifier for obtaining an appropriate pressure-sensitive adhesive property before and after the curing by energy ray, and an aging resistor and an antioxidant for improving the durability.

As a preferred energy ray-curable pressure-sensitive adhesive, employed is a composition containing an energy ray-curable compound in the base component (pressure-sensitive adhesive), preferably a UV-curable pressure-sensitive adhesive containing a UV-curable compound in an acrylic pressure-sensitive adhesive. As a particularly preferable embodiment of the energy ray-curable pressure-sensitive adhesive, employed is a UV-curable pressure-sensitive adhesive containing a side-chain-acrylate-containing acrylic pressure-sensitive adhesive, an acrylate type crosslinking agent (a compound containing poly(meth)acryloyl group; or polyfunctional acrylate), and an ultraviolet photoinitiator. The side-chain-acrylate-containing acrylic pressure-sensitive adhesive means an acrylic polymer in which an acrylate group is introduced into the side chain, and a material similar to that described above may be prepared by a similar method and used. The acrylate type crosslinking agent is a low-molecular weight compound described above as an example of the poly(meth)acryloyl group-containing compound. The ultraviolet photoinitiator may be one described above as an example of the representative energy ray polymerization initiator.

Furthermore, as a pressure-sensitive adhesive constituting the pressure-sensitive adhesive layer 3, a non-energy ray-curable pressure-sensitive adhesive based on the acrylic pressure-sensitive adhesives described above can also be used. In this case, a pressure-sensitive adhesive having a pressure-sensitive adhesive power smaller than the peel stress upon forming a tubular roll can be appropriate, and for example, in a 180° peel test (room temperature (25° C.)) using a silicon mirror wafer as the adherend, a pressure-sensitive adhesive having a pressure-sensitive adhesive power of 6.5 N/10 mm or less (for example, 0.05 to 6.5 N/10 mm, preferably 0.2 to 6.5 N/10 mm), and particularly 6.0 N/10 mm or less (for example, 0.05 to 6.0 N/O mm, preferably 0.2 to 6.30 N10 mm) can be used.

As such non-energy ray-curable pressure-sensitive adhesive based on the acrylic pressure-sensitive adhesive having a small pressure-sensitive adhesive power, an acrylic pressure-sensitive adhesive prepared by adding to a copolymer of a (meth)acrylic acid alkyl ester [for example, a (meth)acrylic acid $C_1$-$C_{20}$ alkyl ester such as methyl (meth)acrylate, ethyl (meth)acrylate, butyl (meth)acrylate], 2-ethylhexyl (meth)acrylate, octyl (meth)acrylate or the like] and a monomer having a reactive functional group [for example, a carboxyl group or acid anhydride group-containing monomer such as acrylic acid, methacrylic acid, itaconic acid, fumaric acid, maleic anhydride or the like; a 1 hydroxyl group-containing monomer such as 2-hydroxyethyl (meth)acrylate or the like; an amino group-containing monomer such as morpholyl (meth)acrylate and the like; an amide group-containing monomer such as (meth)acrylamide or the like; or the like], and another optionally used copolymerizable monomer [for example, a (meth)acrylic acid ester having an alicyclic hydrocarbon group, such as isobornyl (meth)acrylate or the like, acrylonitrile, or the like], a crosslinking agent capable of reacting with the reactive functional group described above [for example, an isocyanate crosslinking agent, a melamine crosslinking agent, an epoxy crosslinking agent, or the like], and crosslinking the copolymer, is preferably used.

The pressure-sensitive adhesive layer 3 may be formed by an ordinary method, such as a method of coating a coating liquid, which is prepared from a pressure-sensitive adhesive, an energy ray-curable compound and an optional solvent, onto the restriction layer 2 (on the stiff film layer 22 in the foregoing example), or a method of coating the coating liquid on an appropriate releasable liner (separator) to form a pressure-sensitive adhesive layer and transferring it onto the restriction layer 2. In the case of the transfer method, a void (gap) may remain in the interface with the restriction layer 2. In such a case, the void may be diffused and removed by a heating/pressurizing process, for example, in an autoclave treatment. The pressure-sensitive adhesive layer 3 may have a single layered structure or a composite layered structure.

The pressure-sensitive adhesive layer 3 in the present invention may further include beads such as glass beads or resin beads. Addition of glass beads or resin beads to the pressure-sensitive adhesive layer 3 increases the shear modulus, thereby facilitating the decrease of the pressure-sensitive adhesive power. The beads have an average particle size, for example, of about from 1 to 100 μm, preferably from 1 to 20 μm. The beads are employed in an amount of from 25 to 200 parts by weight, preferably from 50 to 100 parts by weight, with respect to 100 parts by weight of the entire pressure-sensitive adhesive layer 3. An excessively large amount of addition may cause a defective dispersion, thereby rendering the coating of the pressure-sensitive adhesive difficult, and an excessively small amount tends to provide only insufficient effects.

The pressure-sensitive adhesive layer 3 has a thickness normally of from 10 to 200 μm, preferably from 20 to 100 μm and more preferably from 30 to 60 μm. When the thickness is excessively small, the pressure-sensitive adhesive power becomes insufficient, whereby the supporting or temporary fixing of the adherend tends to become difficult. On the other hand, when it is excessively large, it is uneconomical and the handling property becomes deteriorated.

The self-rolling laminated sheet of the present invention can be produced by superposing the shrinkable film layer 1 and the restriction layer 2 (elastic layer 21 and stiff film layer 22 in the above-described embodiment) and laminating these, utilizing laminating means such as a hand roller or a laminator or atmospheric pressure compressing means such as an autoclave, selectively according to the purpose. Further, the self-rolling pressure-sensitive adhesive sheet of the present invention can be produced by providing the pressure-sensitive adhesive layer 3 on the surface of the restriction layer 2 of the self-rolling laminated sheet, or by superposing and laminating the restriction layer 2 (or stiff film layer 22), provided on a side thereof with the pressure-sensitive adhesive layer 3 in advance, with the shrinkable film layer 1 (or the shrinkable film layer 1 and the elastic layer 21).

The self-rolling pressure-sensitive adhesive sheet of the invention can be utilized as a protective pressure-sensitive adhesive sheet for a semiconductor or the like, or a fixing pressure-sensitive adhesive sheet for a semiconductor wafer or the like, and can more specifically be used as a pressure-sensitive adhesive sheet for back grinding of a silicon semiconductor, a pressure-sensitive adhesive sheet for back grinding of a compound semiconductor, a pressure-sensitive adhesive sheet for dicing of a silicon semiconductor, a pressure-sensitive adhesive sheet for dicing of a compound semiconductor, a pressure-sensitive adhesive sheet for dicing of a semiconductor package, a pressure-sensitive adhesive sheet for dicing of a glass, and a pressure-sensitive adhesive sheet for dicing of ceramics. It is particularly useful as a pressure-sensitive adhesive sheet for semiconductor, such as a pressure-sensitive adhesive sheet for protecting a semiconductor and a pressure-sensitive adhesive sheet for fixing a semiconductor wafer.

In the following, a working process for an adherend, utilizing the self-rolling pressure-sensitive adhesive sheet of the invention, will be described. The self-rolling pressure-sensitive adhesive sheet of the invention is adhered to an adherend for temporarily fixation. Then, after a necessary processing is applied to the adherend (worked article), the pressure-sensitive adhesive power of the pressure-sensitive adhesive layer of the self-rolling pressure-sensitive adhesive sheet is lowered and a stimulus such as heat is provided to induce the contraction of the shrinkable film layer 1, thereby causing the self-rolling pressure-sensitive adhesive sheet to spontaneously roll up either in one direction (usually along the principal shrinking axis) from an end or from the two opposing ends toward a center (usually along the principal shrinking axis), thereby forming one or two tubular rolls and to be thus peeled off from the adherend, whereby a completed article can be obtained. In the case of spontaneous rolling in one direction from an end of the self-rolling pressure-sensitive adhesive sheet, one tubular roll is formed (one-directional rolled peeling), and, in the case of spontaneous rolling from the two opposing ends of the self-rolling pressure-sensitive adhesive sheet toward the center, two tubular rolls, positioned in parallel, are formed (two-directional rolled peeling).

Representative examples of the worked article include a semiconductor wafer. Examples of working include cutting, dicing, grinding, etching, lathing, and heating however limited to a temperature equal to or lower than a thermal shrinkage starting temperature, in the case that the shrinkable film layer is a thermally shrinkable film layer), and are not particularly restricted so long as the working can be executed utilizing the pressure-sensitive adhesive sheet.

After the working on the worked article, for example, in the case that the pressure-sensitive adhesive layer is an energy ray-curable pressure-sensitive adhesive layer and that the shrinkable film layer is a thermally shrinkable film layer, the pressure-sensitive adhesive layer is irradiated with an energy ray and the thermally shrinkable film layer is heated by heating means. Thus the pressure-sensitive adhesive layer is cured and loses the pressure-sensitive adhesive power while the shrinkable film layer is going to cause a deformation by contraction, whereby the pressure-sensitive adhesive sheet is lifted up in the external edge portion thereof and spontaneously runs in one direction (or in two directions opposite to each other (toward the center)) under rolling of the pressure-sensitive adhesive sheet from such external edge portion (or from two opposing external edge portions), thereby forming one tubular roll (or two tubular rolls). In such operation, the shrinking direction of the pressure-sensitive adhesive sheet is regulated by the restriction layer, the rolling takes place in one axial direction to promptly form the tubular roll. Therefore, the pressure-sensitive adhesive sheet can be peeled off extremely easily and cleanly from the adherend (worked article). The heating temperature may be suitably selected according to the shrinking property of the thermally shrinkable film layer, and is for example from 70 to 180° C., preferably from 70 to 140° C. The irradiation with the energy ray and the heating may be executed simultaneously or stepwise. Furthermore, heating may be performed not only by heating the adherend uniformly over the entire surface, but also by gradually heating the entire surface, and further by partially heating only to provide a peel starting point. Heating must be appropriately selected for the purpose of utilizing easy peelability.

Figure 3A:
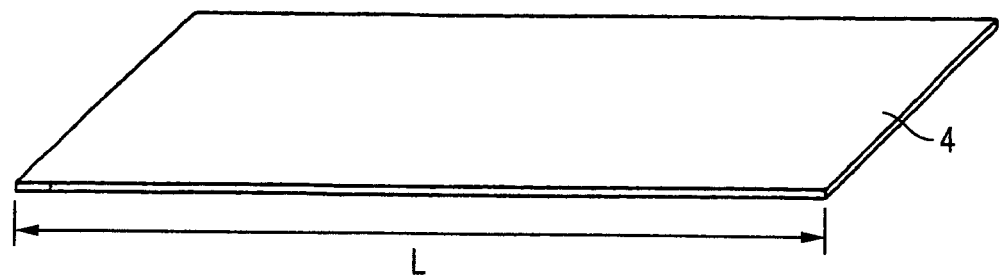
Figure 3B:
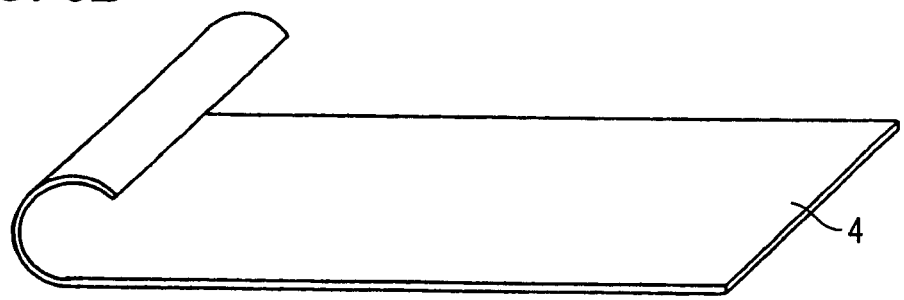
Figure 3C:
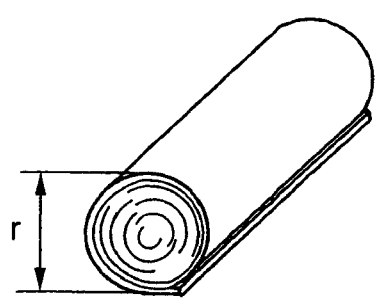
Figure 3D:
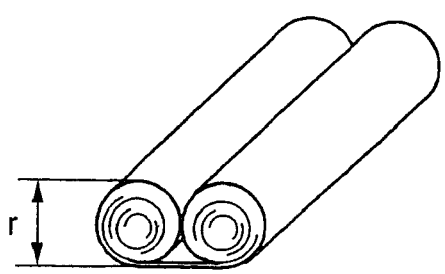

FIGS. 3A to 3D are views (perspective views) illustrating the mode of spontaneous rolling of the self-rolling laminated sheet or pressure-sensitive adhesive sheet of the present invention, wherein FIG. 3A is a view illustrating the self-rolling laminated sheet or pressure-sensitive adhesive sheet prior to the provision of stimulus inducing the contraction of the shrinkable film; FIG. 3B is a view illustrating a state where the self-rolling laminated sheet or pressure-sensitive adhesive sheet, subjected to the provision of stimulus inducing the contraction of the shrinkable film layer (pressure-sensitive adhesive sheet after the pressure-sensitive adhesive power of the pressure-sensitive adhesive layer is lowered or lost), starts to roll up from an external edge portion (one end portion) in one direction (normally along the principal shrinking axis of the shrinkable film); FIG. 3C is a view illustrating a state where the rolling of the sheet is completed and one tubular roll is formed (one-directional rolling); and FIG. 3D is a view illustrating a state where the sheet spontaneously rolls up from the two opposing ends toward the center (normally along the principal shrinking axis of the shrinkable film) thereby forming two tubular rolls (two-directional rolling). The self-rolling laminated sheet and the self-rolling pressure-sensitive adhesive sheet have scarce difference in the spontaneous roll-up property. Whether the laminated sheet or the pressure-sensitive adhesive sheet undergoes a one-directional rolling or a two-directional rolling varies, for example, depending on the pressure-sensitive adhesive power of the restriction layer to the shrinkable film layer and the shear modulus of the restriction layer (particularly elastic layer).

In FIGS. 3A to 3D, L indicates the length (or diameter in case of a circular sheet) of the self-rolling laminated sheet or pressure-sensitive adhesive sheet 4 in the rolling direction (usually along the principal shrinking axis of the shrinkable film layer) (cf. FIG. 3A), and r indicates the diameter of the formed tubular roll (or maximum diameter when the diameter of the tubular roll is not uniform along the longitudinal direction of the rolled member, for example in the case that the sheet is circular) (cf. FIGS. 3C and 3D). For the self-rolling laminated sheet or pressure-sensitive adhesive sheet of the present invention, r/L is preferably in the range of 0.001 to 0.333, and more preferably in the range of 0.01 to 0.2. L is, for example, 10 to 2000 mm, and preferably 300 to 1000 mm. The length perpendicular to L in the laminated sheet or the pressure-sensitive adhesive sheet is, for example, about 10 to 2000 mm, and preferably 300 to 1000 mm. The value of r/L can be set to the above-described range by adjusting the type, composition, thickness and the like of the material in the respective layers of the shrinkable film layer 1, the restriction layer 2 (elastic layer 21 and stiff film layer 22), and the pressure-sensitive adhesive layer 3, particularly the shear modulus and thickness of the elastic layer 21 constituting the restriction layer 2, and the Young's modulus and thickness of the stiff film layer 22 also constituting the restriction layer 2. In the present embodiment, the shape of the self-rolling laminated sheet or pressure-sensitive adhesive sheet is quadrangle, but it is not restricted to such shape but may be suitably selected according to the purpose and may be any of circular, oval and polygonal shapes. In the case that two tubular rolls are formed, the formed two tubular rolls each has a ratio (r/L) within the above-mentioned range.

The self-rolling pressure-sensitive adhesive sheet of the present invention, when it is employed in a working of an adherend (worked article), allows to avoid a breakage of the worked article by the stress at peeling, and, even in a case of working a fragile adherend such as a thin semiconductor wafer, the pressure-sensitive adhesive sheet can be easily peeled off from the adherend without breakage or contamination thereof.

EXAMPLES

In the following the present invention will be further clarified by examples, but the present invention is not limited by such examples. The shear modulus of the elastic layer and the stiff film layer, and the pressure-sensitive adhesive power of the elastic layer to the shrinkable film were measured in the following manner. Additionally, the r/L which is an index for determining as to whether the sheet functions as a tubular roll, was defined by the method described below.

Measurement of Young's Modulus (80° C.) of Stiff Film Layer

The Young's modulus of the stiff film layer was measured by the following method according to JIS K7127. As the tensile tester Autograph AG-1kNG (heating hood equipped) manufactured by Shimadzu Corporation was used. A stiff film cut to a size of length 200 mm×width 10 mm was attached at a chuck distance of 100 mm. After providing an atmosphere of 80° C. by a heating hood, the sample was pulled at a tensile rate of 5 mm/min, and a measurement value for the stress-strain relationship was obtained. Loads at two points where the strain was 0.2% and 0.45% were determined to obtain Young's modulus. This measurement was repeated 5 times for the same sample, and the average value was employed.

Measurement of Shear Modulus (80° C.) of Elastic Layer

The shear modulus of the elastic layer was measured by the following method. An elastic layer as described in each of Examples and Comparative Examples was prepared to have a thickness of from 1.5 to 2 mm, and was punched with a punch having a diameter of 7.9 mm to obtain a sample for measurement. The measurement was conducted using a viscoelastic spectrometer (ARES) manufactured by Rheometric Scientific Inc., under a chuck pressure of 100 g and a shear frequency of 1 Hz [used 8-mm parallel plates made of stainless steel (manufactured by TA Instruments, Inc., type 708.0157)]. Shear modulus at 80° C. was used.

Measurement of Pressure-Sensitive Adhesive Power of Elastic Layer to Shrinkable Film The pressure-sensitive adhesive power of the elastic layer to the shrinkable film was measured by a 180° peel test (50° C.). A laminated sheet [prepared in the same manner as the pressure-sensitive adhesive sheet except that the pressure-sensitive adhesive layer (energy ray-curable pressure-sensitive adhesive layer, non-energy ray-curable pressure-sensitive adhesive layer) was not provided, provided that if the laminated sheet contains an ultraviolet-reactive crosslinking agent in the elastic layer but has not been irradiated with ultraviolet ray, the laminated sheet is irradiated with ultraviolet light at an intensity of 500 mJ/cm$^2$ and then used] was cut to a size of width 10 mm, and the surface on the stiff film layer side (22 in FIG. 1) was bonded to a rigid supporting substrate (silicon wafer) using a pressure-sensitive adhesive tape, and a tensile fig of a peel tester was bonded to the surface on the shrinkable film layer side using a pressure-sensitive adhesive tape. The assembly was placed on a heating stage (heater) at 50° C., such that the rigid supporting substrate was in contact with the heating stage. The tensile jig was pulled in the 180° direction at a tensile speed of 300 mm/min, and the force (N/10 mm) of when peeling occurred between the shrinkable film layer and the elastic layer was measured. To eliminate a measurement error due to the variance in the stiff supporting substrate thickness, the thickness of the stiff supporting substrate was standardized to 38 μm.

Measurement of Pressure-Sensitive Adhesive Power of Non-Energy Ray-Curable Pressure-Sensitive Adhesive Layer to Silicon Mirror Wafer Each of the laminates of three types of non-energy ray-curable pressure-sensitive adhesives obtained in the following Production Examples 4 to 6 was bonded to a polyethylene terephthalate substrate (thickness 38 μm) using a hand roller. This was cut to a size of width 10 mm, was removed of the releasing sheet, and then was bonded to a 4 inch mirror silicon wafer (manufactured by Shin-Etsu Semiconductor Co., Ltd., trade name "CZ-N") using a hand roller. A tensile jig of a peel tester was bonded to this assembly using a pressure-sensitive adhesive tape. The tensile jig was pulled in the 180° direction at a tensile speed of 300 mm/min, and the force (N/10 mm) of when peeling occurred between the shrinkable film layer and the elastic layer was measured.

Also, for each of the energy ray-curable pressure-sensitive adhesive layers obtained in the following Production Examples 1 to 3, the pressure-sensitive adhesive power to a 4-inch mirror silicon wafer (manufactured by Shin-Etsu Semiconductor Co., Ltd., trade name "CZ-N") was measured in the same manner as in the above, except that exposure to ultraviolet light was conducted at an intensity of 500 mJ/cm$^2$ before measurement. As a result, the pressure-sensitive adhesive power was sufficiently decreased in all of the pressure-sensitive adhesives for peeling at 0.01 N/10 mm or less. Because of this, in the following Examples, the description about the pressure-sensitive adhesive power of an energy ray-curable pressure-sensitive adhesive layer to a silicon wafer will be omitted.

Measurement of r/L Value

Each of the pressure-sensitive adhesive sheets obtained in the following Examples was cut to a size of 100 mm×100 mm, and then one prepared using an energy ray-curable pressure-sensitive adhesive was irradiated with ultraviolet light at about 500 mJ/cm$^2$. One end portion of the pressure-sensitive adhesive sheet was immersed in hot water at 80° C. along the contraction axial direction of the shrinkable film to accelerate deformation. For a pressure-sensitive adhesive sheet turned into a tubular roll, the diameter was determined suing a ruler, and this value was divided by 100 mm to obtain r/L.

A laminated sheet having no pressure-sensitive adhesive layer shows the same behavior as a pressure-sensitive adhesive sheet having a pressure-sensitive adhesive layer in terms of the self-rolling property.

Production Examples for Pressure-Sensitive Adhesive Layer

Production Example 1

Production of Energy Ray-Curable Pressure-Sensitive Adhesive Layer (1)

In an acrylic polymer, 80% of the hydroxyl group derived from 2-hydroxyethyl acrylate of an acrylic polymer [obtained by copolymerizing a composition: butyl acrylate ethyl acrylate:2-hydroxyethylacrylate=50:50:20 (weight ratio)] was bound to methacryloyloxyethyl isocyanate (2-isocyanatoethyl methacrylate), to produce an acrylic polymer having a methacrylate group in the side chain. 100 parts by weight of this acrylic polymer having a methacrylate group in the side chain was mixed with 50 parts by weight of pentaerytyritol tetraacrylate as a compound containing two or more functional groups having a carbon-carbon double bond, 6 parts by weight of a photoinitiator (manufactured by Ciba Geigy, Ltd.), trade name "Irgacure 184"), 1.5 parts by weight of a crosslinking agent (trade name "Coronate L"), and 40 parts by weight of a thickening agent (manufactured by Soken Chemical & Engineering Co., Ltd.), trade name "MX500", polymethyl methacrylate beads), to produce an energy ray-curable pressure-sensitive adhesive.

The obtained energy ray-curable pressure-sensitive adhesive was coated on a releasable sheet (manufactured by Mitsubishi Polyester Film Co., trade name "MRF38") using an applicator, and dried to remove volatile substances such as solvent, to obtain a laminate having an energy ray-curable pressure-sensitive adhesive layer with a thickness of 30 μm provided on the releasable sheet.

Production Example 2

Production of Energy Ray-Curable
Pressure-Sensitive Adhesive Layer (2)

In an acrylic polymer, 80% of the hydroxyl group derived from 2-hydroxyethyl acrylate of an acrylic polymer [obtained by copolymerizing a composition: butyl acrylate:ethyl acrylate:2-hydroxyethylacrylate=50:50:20 (weight ratio)] was bound to methacryloyloxyethyl isocyanate (2-isocyanatoethyl methacrylate), to produce an acrylic polymer having a methacrylate group in the side chain. 100 parts by weight of this acrylic polymer having a methacrylate group in the side chain was mixed with 100 parts by weight of "Ultraviolet UV1700" (trade name) manufactured by Nippon Synthetic Chemical Industry Co., Ltd., as a compound containing two or more functional groups having a carbon-carbon double bond, 3 parts by weight of a photoinitiator (manufactured by Ciba Geigy, Ltd.), trade name "Irgacure 184"), and 1.5 parts by weight of a crosslinking agent (trade name "Coronate L"), to produce an energy ray-curable pressure-sensitive adhesive.

The obtained energy ray-curable pressure-sensitive adhesive was coated on a releasable sheet (manufactured by Mitsubishi Polyester Film Co., trade name "MRF38") using an applicator, and dried to remove volatile substances such as solvent, to obtain a laminate having an energy ray-curable pressure-sensitive adhesive layer with a thickness of 30 μm provided on the releasable sheet.

Production Example 3

Production of Energy Ray-Curable
Pressure-Sensitive Adhesive Layer (3)

In an acrylic polymer, 80% of the hydroxyl group derived from 2-hydroxyethyl acrylate of an acrylic polymer [obtained by copolymerizing a composition: butyl acrylate:ethyl acrylate:2-hydroxyethylacrylate=50:50:20 (weight ratio)] was bound to methacryloyloxyethyl isocyanate (2-isocyanatoethyl methacrylate), to produce an acrylic polymer having a methacrylate group in the side chain. 100 parts by weight of this acrylic polymer having a methacrylate group in the side chain was mixed with 50 parts by weight of "Ultraviolet UV1700" (trade name) manufactured by Nippon Synthetic Chemical Industry Co., Ltd., as a compound containing two or more functional groups having a carbon-carbon double bond, 3 parts by weight of a photoinitiator (manufactured by Ciba Geigy, Ltd.), trade name "Irgacure 184"), and 1.5 parts by weight of a crosslinking agent (trade name "Coronate L"), to produce an energy ray-curable pressure-sensitive adhesive.

The obtained energy ray-curable pressure-sensitive adhesive was coated on a releasable sheet (manufactured by Mitsubishi Polyester Film Co., trade name "MRF38") using an applicator, and dried to remove volatile substances such as solvent, to obtain a laminate having an energy ray-curable pressure-sensitive adhesive layer with a thickness of 30 μm provided on the releasable sheet.

Production Example 4

Production of Non-Energy Ray-Curable
Pressure-Sensitive Adhesive Layer (1)

100 parts by weight of an acrylic copolymer [obtained by copolymerizing butyl acrylate:acrylic acid=100:3 (weight ratio)] was mixed with 0.7 parts by weight of "Tetrad C" (trade name) manufactured by Mitsubishi Gas Chemical Company, Inc., and 2 parts by weight of a crosslinking agent (trade name "Coronate L"), to produce a non-energy ray-curable pressure-sensitive adhesive.

The obtained non-energy ray-curable pressure-sensitive adhesive was coated on a releasable sheet (manufactured by Mitsubishi Polyester Film Co., trade name "MRF38") using an applicator, and dried to remove volatile substances such as solvent to obtain a laminate having a non-energy ray-curable pressure-sensitive adhesive layer with a thickness of 30 μm provided on the releasable sheet.

Production Example 5

Production of Non-Energy Ray-Curable
Pressure-Sensitive Adhesive Layer (2)

100 parts by weight of an acrylic copolymer [obtained by copolymerizing 2-ethylhexyl acrylate:morpholyl acrylate: acrylic acid:2-hydroxyethyl acrylate=75:25:3:0.1 (weight ratio)] was mixed with 1 part by weight of "Tetrad C" (trade name) manufactured by Mitsubishi Gas Chemical Company, Inc., 2 parts by weight of a crosslinking agent (trade name "Coronate L"), and 0.05 parts by weight of "Epan 710" (trade name) manufactured by Dai-Ichi Kogyo Seiyaku Co., Ltd., to produce a non-energy ray-curable pressure-sensitive adhesive.

The obtained non-energy ray-curable pressure-sensitive adhesive was coated on a releasable sheet (manufactured by Mitsubishi Polyester Film Co., trade name "MRF38") using an applicator, and dried to remove volatile substances such as solvent, to obtain a laminate having a non-energy ray-curable pressure-sensitive adhesive layer with a thickness of 30 μm provided on the releasable sheet.

Production Example 6

Production of Non-Energy Ray-Curable
Pressure-Sensitive Adhesive Layer (3)

100 parts by weight of an acrylic copolymer (manufactured by Dai-ichi Lace Mfg. Co., Ltd., trade name "Rheocote R1020S") was mixed with 0.5 parts by weight of "Tetrad C" (trade name) manufactured by Mitsubishi Gas Chemical Company, Inc., and 8 parts by weight of a crosslinking agent (trade name "Coronate L"), to produce a non-energy ray-curable pressure-sensitive adhesive.

The obtained non-energy ray-curable pressure-sensitive adhesive was coated on a releasable sheet (manufactured by Mitsubishi Polyester Film Co., trade name "MRF38") using an applicator, and dried to remove volatile substances such as solvent, to obtain a laminate having a non-energy ray-curable pressure-sensitive adhesive layer with a thickness of 30 μm provided on the releasable sheet.

Production Example 7

Production of Non-Energy Ray-Curable
Pressure-Sensitive Adhesive Layer (4)

100 parts by weight of an acrylic copolymer [obtained by copolymerizing 2 ethylhexyl acrylate:morpholyl acrylate: acrylic acid:2-hydroxyethyl acrylate=75:25:3:0.1 (weight ratio)] was mixed with 0.5 parts by weight of "Tetrad C" (trade name) manufactured by Mitsubishi Gas Chemical Company, Inc., 2 pats by weight of a crosslinking agent (trade name "Coronate L"), and 0.05 parts by weight of a crosslinking agent (trade name "Coronate L"), to produce a non-energy ray-curable pressure-sensitive adhesive.

The obtained non-energy ray-curable pressure-sensitive adhesive was coated on a releasable sheet (manufactured by Mitsubishi Polyester Film Co., trade name "MRF38") using an applicator, and dried to remove volatile substances such as solvent, to obtain a laminate having a non-energy ray-curable pressure-sensitive adhesive layer with a thickness of 30 μm provided on the releasable sheet.

Production Examples for Pressure-Sensitive Adhesive Sheet

Example 1

45 parts by weight of isobornyl acrylate, 45 parts by weight of 2-ethylhexyl acrylate, 10 parts by weight of acrylic acid, 0.1 pats by weight of hexanediol diacrylate, 0.05 parts by weight of "Irgacure 651" (photoinitiator, manufactured by Ciba-Geigy, Ltd.) and 0.05 parts by weight of "Irgacure 184" (photoinitiator, manufactured by Ciba-Geigy, Ltd.) were mixed and irradiated with ultraviolet light for 1 hour to obtain a prepolymer. This prepolymer was coated on one surface of a polyethylene terephthalate film (PET film, thickness: 38 μm, manufactured by Toray Industries, Inc., trade name "Lumirror S10") which served as a stiff film layer, and a thermally shrinkable film (uniaxially stretched polyester film, thickness: 60 μm, manufactured by Toyobo Co., trade name "Space Clean S7053") was superimposed thereon and laminated using a hand roller. Final curing was conducted by irradiating both sides with ultraviolet ray, to obtain a laminated sheet (thickness of the acrylic pressure-sensitive adhesive layer: 105 μm).

The energy ray-curable pressure-sensitive adhesive layer (1) side of the laminate obtained in Production Example 1 was laminated on the stiff film layer side of the laminated sheet obtained above. The obtained laminate was passed through a laminator to adhere closely, thereby obtaining an adhesive sheet including a thermally shrinkable film layer, a restriction layer [acrylic pressure-sensitive adhesive layer (elastic layer)/PET film layer (stiff film layer)], an energy ray-curable pressure-sensitive adhesive layer (1) and a releasable sheet laminated in this order.

The thermally shrinkable film had a thermal shrinkage in the principal direction of contraction of 70% or higher at 100° C.

The acrylic pressure-sensitive adhesive layer (elastic layer) had a shear modulus (80° C.) of $0.126 \times 10^6$ N/m$^2$, and the product of shear modulus and thickness was 13.2 N/m. The pressure-sensitive adhesive power (50° C.) of the acrylic pressure-sensitive adhesive layer (elastic layer) to the thermally shrinkable film layer was 4.9 N/10 mm.

Young's modulus of the PET film layer (stiff film layer) at 80° C. was $3.72 \times 10^9$ N/m$^2$, and the product of Young's modulus and thickness was $1.41 \times 10^5$ N/m.

The value of r/L was 0.06.

Example 2

A pressure-sensitive adhesive sheet was obtained by the same method as in Example 1, except that the PET film in Example 1 was replaced with "Lumirror S10" (trade name) having a thickness of 25 μm, manufactured by Toray Industries, Inc.

Young's modulus of the PET film layer (stiff film layer) at 80° C. was $3.72 \times 10^9$ N/m$^2$, and the product of Young's modulus and thickness was $0.93 \times 10^5$ N/m.

The value of r/L was 0.06.

Example 3

A polymer solution containing 100 parts by weight of an acrylic polymer (a polymer obtained by copolymerizing 1 part by weight of 2-hydroxyethyl acrylate, 70 parts by weight of butyl acrylate, 30 parts by weight of ethyl acrylate, and 5 parts by weight acrylic acid), 10 parts by weight of dipentaerythritol hexaacrylate, 1 part by weight of "Tetrad C" (crosslinking agent, manufactured by Mitsubishi Gas Chemical Co., Ltd.), 2 parts by weight of "Coronate L" (crosslinking agent, manufactured by Nippon Polyurethane Industry, Co., Ltd.), and 3 parts by weight of "Irgacure 651" (photoinitiator, manufactured by Ciba-Geigy, Ltd.) dissolved in toluene, was coated on one surface of a polyethylene terephthalate film (PET film, thickness: 38 μm, manufactured by Toray Industries, Inc., trade name "Lumirror S10") which served as a stiff film layer, and "Space Clean S5630" (trade name) (uniaxially stretched polyester film) having a thickness of 60 μm, manufactured by Toyobo Co., was superimposed thereon and laminated using a hand roller to obtain a laminated sheet (thickness of the acrylic pressure-sensitive adhesive layer: 30 μm).

The energy ray-curable pressure-sensitive adhesive layer (1) side of the laminate obtained in Production Example 1 was laminated on the stiff film layer side of the laminated sheet obtained above. The obtained laminate was passed through a laminator to adhere closely, thereby obtaining a pressure-sensitive adhesive sheet including a thermally shrinkable film layer, a restriction layer [acrylic pressure-sensitive adhesive layer (elastic layer)/PET film layer (stiff film layer)), an energy ray-curable pressure-sensitive adhesive layer (1) and a releasable sheet laminated in this order.

The thermally shrinkable film had a thermal shrinkage in the principal direction of contraction of 70% or higher at 100° C.

The acrylic pressure-sensitive adhesive layer (elastic layer) had a shear modulus (80° C.) of $0.689 \times 10^6$ N/m$^2$, and the product of shear modulus and thickness was 20.67 N/m. The pressure-sensitive adhesive power (at 50° C.) of the acrylic pressure-sensitive adhesive layer (elastic layer) to the thermally shrinkable film layer was 4.9 N10 mm.

The value of r/L was 0.055.

Example 4

A polymer solution containing 100 parts by weight of an acrylic polymer (manufactured by Dai-ichi Lace Mfg. Co., trade name "Rheocote R1020S"), 10 parts by weight of a pentaerythritol-modified acrylate crosslinking agent (manufactured by Nippon Kayaku Co., Ltd., trade name "DPHA401H"), 0.25 parts by weight of "Tetrad C" (crosslinking agent, manufactured by Mitsubishi Gas Chemical Co., Ltd.), 2 parts by weight of "Coronate L" (crosslinking agent, manufactured by Nippon Polyurethane Industry, Co., Ltd.), and 3 parts by weight of "Irgacure 651" (photoinitiator, manufactured by Ciba-Geigy, Ltd.) dissolved in methyl ethyl ketone, was coated on one surface of a polyethylene terephthalate film (ET film, thickness: 38 μm, manufactured by Toray Industries, Inc., trade name "Lumirror S10") which served as a stiff film layer, and a thermally shrinkable film (uniaxially stretched polyester film, thickness: 60 μm, manufactured by Toyobo Co., trade name "Space Clean S5630") was superimposed thereon and laminated using a hand roller to obtain a laminated sheet (thickness of the acrylic pressure-sensitive adhesive layer: 30 μm).

The energy ray-curable pressure-sensitive adhesive layer (1) side of the laminate obtained in Production Example 1 was laminated on the stiff film layer side of the laminated sheet obtained above. The obtained laminate was passed through a laminator to adhere closely, thereby obtaining a pressure-sensitive adhesive sheet including a thermally shrinkable film layer, a restriction layer [acrylic pressure-sensitive adhesive layer (elastic layer)/PET film layer (stiff film layer)], an energy ray-curable pressure-sensitive adhesive layer (1) and a releasable sheet laminated in this order.

The acrylic pressure-sensitive adhesive layer (elastic layer) had a shear modulus (80° C.) of $0.72 \times 10^6$ N/m$^2$, and the product of shear modulus and thickness was 21.6 N/m. The pressure-sensitive adhesive power (at 50° C.) of the acrylic pressure-sensitive adhesive layer (elastic layer) to the thermally shrinkable film layer was 4.4 N/10 mm.

The value of r/L was 0.045.

Example 5

A pressure-sensitive adhesive sheet was obtained in the same manner as in Example 4, except that the polyethylene terephthalate film as the stiff film layer in Example 4 was made to have a thickness of 50 μm. Young's modulus of the PET film layer (stiff film layer) at 80° C. was $3.72 \times 10^9$ N/m$^2$, and the product of Young's modulus and thickness was $1.86 \times 10^5$ N/m.

The value of r/L was 0.06.

Example 6

A pressure-sensitive adhesive sheet was obtained in the same manner as in Example 4, except that the polyethylene terephthalate film as the stiff film layer in Example 4 was made to have a thickness of 75 μm. Young's modulus of the PET film layer (stiff film layer) at 80° C. was $3.72 \times 10^9$ N/m$^2$, and the product of Young's modulus and thickness was $2.79 \times 10^5$ N/m.

The value of r/L was 0.095.

Example 7

A pressure-sensitive adhesive sheet was obtained in the same manner as in Example 5, except that the energy ray-curable pressure-sensitive adhesive layer (2) obtained in Production Example 2 was used with respect to Example 5.

The value of r/L was 0.065.

Example 8

A pressure-sensitive adhesive sheet was obtained in the same manner as in Example 7, except that the polyethylene terephthalate film as the stiff film layer in Example 7 was made to have a thickness of 75 μm.

The value of r/L was 0.1.

Example 9

A polymer solution containing 100 parts by weight of an acrylic polymer (manufactured by Dai-ichi Lace Mfg. Co., trade name "Rheocote R1020S"), 10 parts by weight of a pentaerythritol-modified acrylate crosslinking agent (manufactured by Nippon Kayaku Co., Ltd., trade name "DPHA40H"), 0.25 parts by weight of "Tetra C" (crosslinking agent, manufactured by Mitsubishi Gas Chemical Co., Ltd.), 2 parts by weight of "Coronate L" (crosslinking agent, manufactured by Nippon Polyurethane Industry, Co., Ltd.), and 3 parts by weight of "Irgacure 651" (photoinitiator, manufactured by Ciba-Geigy, Ltd.) dissolved in methyl ethyl ketone, was coated on one surface of a polyethylene terephthalate film (PET film, thickness: 38 μm, manufactured by Toray Industries, Inc., trade name "Lumirror S10") which served as a stiff film layer, and a thermally shrinkable film (uniaxially stretched polyester film, thickness: 60 μm, manufactured by Toyobo Co., trade name "Space Clean S7053") was superimposed thereon and laminated using a hand roller to obtain a laminated sheet (thickness of the acrylic pressure-sensitive adhesive layer: 30 μm).

The energy ray-curable pressure-sensitive adhesive layer (3) side of the laminate obtained in Production Example 3 was laminated on the stiff film layer side of the laminated sheet obtained above. The obtained laminate was passed through a laminator to adhere closely, thereby obtaining an adhesive sheet including a thermally shrinkable film layer, a restriction layer [acrylic pressure-sensitive adhesive layer (elastic layer)/PET film layer (stiff film layer)], an energy ray-curable pressure-sensitive adhesive layer (3) and a releasable sheet laminated in this order.

The pressure-sensitive adhesive power (50° C.) of the acrylic pressure-sensitive adhesive layer (elastic layer) to the thermally shrinkable film layer was 4.4 N/10 mm.

The value of r/L was 0.05.

Example 10

A pressure-sensitive adhesive sheet was obtained in the same manner as in Example 9, except that the polyethylene terephthalate film as the stiff film layer in Example 9 was made to have a thickness of 50 μm.

The value of r/L was 0.045.

Example 11

A polymer solution containing 100 parts by weight of an acrylic polymer (manufactured by Dai-ichi Lace Mfg. Co., trade name "Rheocote R1020S"), 10 parts by weight of a pentaerythritol-modified acrylate crosslinking agent (manufactured by Nippon Kayaku Co., Ltd., trade name "DPHA40H"), 0.25 parts by weight of "Tetrad C" (crosslinking agent, manufactured by Mitsubishi Gas Chemical Co., Ltd.), 2 parts by weight of "Coronate L" (crosslinking agent, manufactured by Nippon Polyurethane Industry, Co., Ltd.), and 3 parts by weight of "Irgacure 651" (photoinitiator, manufactured by Ciba-Geigy, Ltd.) dissolved in methyl ethyl ketone, was coated on a releasable sheet (manufactured by Mitsubishi Polyester Film Co., Ltd., trade name "MRF38") using an applicator, and dried to remove volatile substances such as solvent to obtain a laminate having an acrylic pressure-sensitive adhesive layer with a thickness of 30 μm provided on the releasable sheet.

A film comprising an ethylene-vinyl acetate copolymer (EVA), having a thickness of 115 ham, as a stiff film was bonded thereon using a hand roller. After peeling off the releasable sheet, a thermally shrinkable film (uniaxially stretched polyester film, thickness: 60 μm, manufactured by Toyobo Co., trade name "Space Clean S55630") was superimposed on the acrylic pressure-sensitive adhesive layer side using a hand roller.

The non-energy ray-curable pressure-sensitive adhesive layer (1) side of the laminate obtained in Production Example 4 was laminated on the stiff film layer side of the laminated sheet obtained above.

The obtained laminate was passed through a laminator to adhere closely, thereby obtaining a pressure-sensitive adhesive sheet including a thermally shrinkable film layer, a restriction layer [acrylic pressure-sensitive adhesive layer (elastic layer)/EVA film layer (stiff film layer)], a non-energy ray-curable pressure-sensitive adhesive layer (1) and a releasable sheet laminated in this order.

Young's modulus at 80° C. of the EVA film layer (stiff film layer) was $1.08 \times 10^7$ N/m$^2$, and the product of Young's modulus and thickness was $1.24 \times 10^3$ N/n.

The pressure-sensitive adhesive power (50° C.) of the acrylic pressure-sensitive adhesive layer (elastic layer) to the thermally shrinkable film layer was 4.4 N/10 mm.

The pressure-sensitive adhesive power of the non-energy ray-curable pressure-sensitive adhesive layer to a silicon wafer was 0.38 N/10 mm.

The value of r/L was 0.055.

Example 12

A polymer solution containing 100 parts by weight of an acrylic polymer (90 parts by weight of 2-ethylhexyl acrylate, 10 parts by weight of acrylic acid), 10 parts by weight of dipentaerythritol hexaacrylate, and 3 parts by weight of "Irgacure 651" (photoinitiator, manufactured by Ciba-Geigy, Ltd.) dissolved in ethyl acetate, was coated on one surface of a polyethylene terephthalate film (PET film, thickness: 38 μm, manufactured by Toray Industries, Inc., trade name "Lumirror S10") as a stiff film layer, and a thermally shrinkable film (uniaxially stretched polyester film, thickness: 60 μm, manufactured by Toyobo Co., trade name "Space Clean S5630") was superimposed thereon to laminate using a hand roller, thus obtaining a laminated sheet (thickness of acrylic pressure-sensitive adhesive layer 30 μm).

The energy ray-curable pressure-sensitive adhesive layer side of the laminate obtained in Production Example 1 was laminated on the stiff film layer side of the laminated sheet obtained above. The obtained laminate was passed through a laminator to adhere closely, thereby obtaining a pressure-sensitive adhesive sheet including a thermally shrinkable film layer, a restriction layer [acrylic pressure-sensitive adhesive layer (elastic layer)/PET film layer (stiff film layer)], an energy ray-curable pressure-sensitive adhesive layer (1) and a releasable sheet laminated in this order.

The acrylic pressure-sensitive adhesive layer (elastic layer) had a shear modulus of $4.79 \times 10^4$ N/m$^2$, and the product of shear modulus and thickness was 1.44 N/m.

The pressure-sensitive adhesive power (50° C.) of the acrylic pressure-sensitive adhesive layer (elastic layer) to the thermally shrinkable film layer was 11.4 N/10 mm.

The value of r/L was 0.055.

Example 13

A polymer solution obtained by mixing 100 parts by weight of an ester polymer (a polymer obtained from 100 parts by weight of PLACCEL CD220PL manufactured by Daicel Chemical Industries, Ltd. and 10 parts by weight of sebacic acid), and 4 pats by weight of "Coronate L" (crosslinking agent, Nippon Polyurethane Industry, Co., Ltd.), was coated on one surface of a polyethylene terephthalate film (PET film, thickness: 50 μm, manufactured by Toray Industries, Inc., trade name "Lumirror S10") as a stiff film layer, and a thermally shrinkable film (uniaxially stretched polyester film, thickness: 60 μm, manufactured by Toyobo Co., trade name "Space Clean S5630") was superimposed thereon to laminate using a hand roller, thus obtaining a laminated sheet (thickness of ester-based pressure-sensitive adhesive layer 30 μm).

The non-energy ray-curable pressure-sensitive adhesive layer (1) side of the laminate obtained in Production Example 4 was laminated on the stiff film layer side of the laminated sheet obtained above. The obtained laminate was passed through a laminator to adhere closely, thereby obtaining a pressure-sensitive adhesive sheet including a thermally shrinkable film layer, a restriction layer [ester-based pressure-sensitive adhesive layer (elastic layer)/PET film layer (stiff film layer)], a non-energy ray-curable pressure-sensitive adhesive layer (1) and a releasable sheet laminated in this order.

The ester-based pressure-sensitive adhesive layer (elastic layer) had a shear modulus of $2.88 \times 10^5$ N/m$^2$, and the product of shear modulus and thickness was 8.64 N/m. The pressure-sensitive adhesive power (50° C.) of the ester-based pressure-sensitive adhesive layer (elastic layer) to the thermally shrinkable film layer was 13 N/10 mm.

The value of r/L was 0.05.

Example 14

A pressure-sensitive adhesive sheet was obtained in the same manner as in Example 13, except that the polyethylene terephthalate film (PET film, thickness: 38 μm, manufactured by Toray Industries, Inc., trade name "Lumirror S10") was used as the stiff film layer in Example 13.

The value of r/L was 0.045.

Example 15

A pressure-sensitive adhesive sheet was obtained in the same manner as in Example 13, except that the energy ray-curable pressure-sensitive adhesive layer (3) obtained in Production Example 3 was used as the pressure-sensitive adhesive layer in Example 13.

The value of r/L was 0.05.

Example 16

A polymer solution obtained by mixing 100 parts by weight of an ester polymer (a polymer obtained from 100 parts by weight of PLACCEL CD220PL manufactured by Daicel Chemical Industries, Ltd. and 10 parts by weight of sebacic acid), and 4 parts by weight of "Coronate L" (crosslinking agent, Nippon Polyuethane Industry, Co., Ltd.), was coated on one surface of a polyethylene terephthalate film (PET film, thickness: 50 μm, manufactured by Toray Industries, Inc., trade name "Lumirror S10") as a stiff film layer, and a thermally shrinkable film (uniaxially stretched polyester film, thickness: 60 μm, manufactured by Toyobo Co., trade name "Space Clean S7053") was superimposed thereon to laminate using a hand roller, thus obtaining a laminated sheet (thickness of ester-based adhesive layer 30 μm).

The energy ray-curable pressure-sensitive adhesive layer (1) side of the laminate obtained in Production Example 1 was laminated on the stiff film layer side of the laminated sheet obtained above.

The obtained laminate was passed through a laminator to adhere closely, thereby obtaining a pressure-sensitive adhesive sheet including a thermally shrinkable film layer, a restriction layer [ester-based pressure-sensitive adhesive layer (elastic layer)/PET film layer (stiff film layer)], an energy ray-curable pressure-sensitive adhesive layer (1) and a releasable sheet laminated in this order.

The pressure-sensitive adhesive power (50° C.) of the ester-based pressure-sensitive adhesive layer (elastic layer) to the thermally shrinkable film layer was 13 N/10 mm.

The value of r/L was 0.06.

Example 17

A solution obtained by mixing 100 parts by weight of an ester polymer (a polymer obtained from 100 parts by weight of PLACCEL CD220PL manufactured by Daicel Chemical Industries, Ltd. and 10 parts by weight of sebacic acid), and 10 parts by weight of "Coronate L" (crosslinking agent, Nippon Polyurethane Industry, Co., Ltd.), was coated on one side of a polyethylene terephthalate film (PET film, thickness: 50 µm, manufactured by Toray Industries, Inc., trade name "Lumirror S10") as a stiff film layer, and a thermally shrinkable film (uniaxially stretched polyester film, thickness: 60 µm, manufactured by Toyobo Co., trade name "Space Clean S5630") was superimposed thereon to laminate using a hand roller, thus obtaining a laminated sheet (thickness of ester-based pressure-sensitive adhesive layer 30 µM).

The non-energy ray-curable pressure-sensitive adhesive layer (1) side of the laminate obtained in Production Example 4 was laminated on the stiff film layer side of the laminated sheet obtained above.

The obtained laminate was passed through a laminator to adhere closely, thereby obtaining a pressure-sensitive adhesive sheet including a thermally shrinkable film layer, a restriction layer [ester-based pressure-sensitive adhesive layer (elastic layer)/PET film layer (stiff film layer)], a non-energy ray-curable pressure-sensitive adhesive layer (1) and a releasable sheet laminated in this order.

The ester-based pressure-sensitive adhesive layer (elastic layer) had a shear modulus of $6.5 \times 10^5$ N/m², and the product of shear modulus and thickness was 19.5 N/m. The pressure-sensitive adhesive power (50° C.) of the ester-based pressure-sensitive adhesive layer (elastic layer) to the thermally shrinkable film layer was 8.2 N/10 mm.

The value of r/L was 0.05.

Example 18

A pressure-sensitive adhesive sheet was obtained in the same manner as in Example 14, except that the non-energy ray-curable pressure-sensitive adhesive (2) of Production Example 5 was used as the pressure-sensitive adhesive layer in Example 14.

The pressure-sensitive adhesive power of the non-energy ray-curable pressure-sensitive adhesive layer to a silicon wafer was 5.68 N/10 mm.

The value of r/L was 0.05.

Example 19

A pressure-sensitive adhesive sheet was obtained in the same manner as in Example 14, except that the non-energy ray-curable pressure-sensitive adhesive (3) of Production Example 6 was used as the pressure-sensitive adhesive layer in Example 14.

The pressure-sensitive adhesive power of the non-energy ray-curable pressure-sensitive adhesive layer to a silicon wafer was 3.17 N±10 mm.

The value of r/L was 0.045.

Comparative Example 1

A pressure-sensitive adhesive sheet was obtained in the same manner as in Example 1, except that "Merinex (trade name) having a thickness of 100 µm, manufactured by Teijin-Dupont Film Co., was used as the PET film in Example 1.

Young's modulus at 80° C. was of the PET film layer (stiff film layer) was $3.38 \times 10^9$ N/m², and the product of Young's modulus and thickness was $3.38 \times 10^5$ N/m.

Upon the measurement of r/L, the shrinking substrate and the elastic layer peeled off (anchoring fracture), and thus a tubular roll could not be obtained. It is conceived that the reason was because the stiffness of the stiff film was too high.

Comparative Example 2

45 parts by weight of isobornyl acrylate, 45 parts by weight of 2-ethylhexyl acrylate, 10 parts by weight of acrylic acid, 0.1 part by weight of hexanediol diacrylate, 0.05 parts by weight of "Irgacure 651" (photoinitiator, Ciba Geigy, Ltd.), 0.05 parts by weight of "Irgacure 184" (photoinitiator, Ciba Geigy, Ltd.), and 8 parts by weight of 2-isocyanatoethyl acrylate (manufactured by Showa Denko Co., Ltd., trade name "Karenz AOI") were mixed, and the mixture was irradiated with ultraviolet light for 1 hour to produce a prepolymer. This prepolymer was coated on one surface of a polyethylene terephthalate film (PET film, thickness: 38 µm, Toray Industries, Ltd., trade name "Lumirror S10") as a stiff film layer, and a thermally shrinkable film (uniaxially stretched polyester film, thickness: 60 µm, manufactured by Toyobo Co., wade name "Space Clean S7053") was superimposed thereon to laminate using a hand roller. Final curing was conducted by irradiating both sides with ultraviolet ray, thus obtaining a laminated sheet (thickness of acrylic adhesive layer 105 µm).

The energy ray-curable pressure-sensitive adhesive layer (1) side of the laminate obtained in Production Example 1 was laminated on the stiff film layer side of the laminated sheet obtained above. The obtained laminate was passed through a laminator to adhere closely, thereby obtaining a pressure-sensitive adhesive sheet including a thermally shrinkable film layer, a restriction layer [acrylic pressure-sensitive adhesive layer (elastic layer)/PET film layer (stiff film layer)], an energy ray-curable pressure-sensitive adhesive layer (1) and a releasable sheet laminated in this order.

The thermal shrinkage in the principal direction of contraction of the thermally shrinkable film was 70% or higher at 100° C.

The shear modulus (80° C.) of the acrylic pressure-sensitive adhesive layer (elastic layer) was $1.8 \times 10^6$ N/m², and the product of shear modulus and thickness was 189 N/m. The pressure-sensitive adhesive power (50° C.) of the acrylic pressure-sensitive adhesive layer (elastic layer) to the thermally shrinkable film layer was 0.3 N/10 mm.

Upon the measurement of r/L, the shrinking substrate and the elastic layer peeled off (anchoring fracture), and thus a tubular roll could not be obtained. It is conceived that the reason was because the stiffness of the stiff film was too high.

Comparative Example 3

A pressure-sensitive adhesive sheet was obtained in the same manner as in Example 4, except that "Merinex" (trade name) having a thickness of 100 µm, manufactured by Teijin-Dupont Film Co., was used as the PET film in Example 4.

Upon the measurement of r/L, the shrinking substrate and the elastic layer peeled off (anchoring fracture), and thus a tubular roll could not be obtained. It is conceived that the reason was because the stiffness of the stiff film was too high.

Comparative Example 4

A polyester-based adhesive "Vylon 63SS" manufactured by Toyobo Co., Ltd. was coated on one surface of a polyethylene terephthalate film (PET film, thickness: 100 mm, manufactured by Teijin-Dupont Film Co., trade name "Merinex") as a stiff film layer, to a thickness of 5 μm using an applicator, and a thermally shrinkable film (uniaxially stretched polyester film, thickness: 60 μm, manufactured by Toyobo Co., Ltd., trade name "Space Clean S7053") was superimposed to laminate thereon using a hand roller.

The energy ray-curable pressure-sensitive adhesive layer (3) side of the laminate obtained in Production Example 3 was laminated on the stiff film layer side of the laminated sheet obtained above. The obtained laminate was passed through a laminator to adhere closely, thereby obtaining a pressure-sensitive adhesive sheet including a thermally shrinkable film layer, a restriction layer [polyester-based adhesive layer (elastic layer)/PET film layer (stiff film layer)], an energy ray-curable pressure-sensitive adhesive layer (3) and a releasable sheet laminated in this order.

The shear modulus (80° C.) of the polyester-based adhesive layer (elastic layer) was $1.41 \times 10^5$ N/m$^2$, and the product of shear modulus and thickness was 0.71 N/m. The pressure-sensitive adhesive power (50° C.) of the polyester-based adhesive layer (elastic layer) to the thermally shrinkable film layer was 7.9 N10 mm.

Upon the measurement of r/L, the shrinking substrate and the elastic layer peeled off (anchoring fracture), and thus a tubular roll could not be obtained. It is conceived that the reason was because the stiffness of the stiff film was too highs or the elasticity (shear modulus×thickness) of the elastic layer was insufficient.

Comparative Example 5

A pressure-sensitive adhesive sheet was obtained in the same manner as in Example 19, except that the non-energy ray-curable pressure-sensitive adhesive (4) of Production Example 7 was used as the adhesive layer in Example 19.

The pressure-sensitive adhesive power of the non-energy ray-curable pressure-sensitive adhesive layer to a silicon wafer was 6.93 N/10 mm.

The value of r/L was 0.05.

A summary of the Examples and Comparative Examples described above is presented in Table 1. Also, the measurement values of r/L are presented in Table 2.

TABLE 1

| | Thermally shrinkable film layer Thickness (μm) | Elastic layer Thickness (μm) | Elastic layer Shear modulus (MPa, 80° C.) | Elastic layer Shear modulus × thickness (N/m) | Pressure-sensitive adhesive power to thermally shrinkable film layer (N/10 mm, 50° C.) | Stiff film (PET) layer Thickness (μm) | Stiff film (PET) layer Young's modulus (GPa, 80° C.) | Stiff film (PET) layer Young's modulus × thickness (N/m) | Pressure-sensitive adhesive layer Composition | Pressure-sensitive adhesive power (N/10 mm, to wafer, room temperature) |
|---|---|---|---|---|---|---|---|---|---|---|
| Example 1 | 60 | 105 | 0.126 | 13.23 | 4.90 | 38 | 3.72 | 1.41E+05 | Production Example 1: Curable(1) | 0.01 or less |
| Example 2 | 60 | 105 | 0.126 | 13.23 | 4.90 | 25 | 3.72 | 9.30E+04 | Production Example 1: Curable(1) | 0.01 or less |
| Example 3 | 60 | 30 | 0.689 | 20.67 | 4.90 | 38 | 3.72 | 1.41E+05 | Production Example 1: Curable(1) | 0.01 or less |
| Example 4 | 60 | 30 | 0.720 | 21.60 | 4.40 | 38 | 3.72 | 1.41E+05 | Production Example 1: Curable(1) | 0.01 or less |
| Example 5 | 60 | 30 | 0.720 | 21.60 | 4.40 | 50 | 3.72 | 1.86E+05 | Production Example 1: Curable(1) | 0.01 or less |
| Example 6 | 60 | 30 | 0.720 | 21.60 | 4.40 | 75 | 3.72 | 2.79E+05 | Production Example 1: Curable(1) | 0.01 or less |
| Example 7 | 60 | 30 | 0.720 | 21.60 | 4.40 | 50 | 3.72 | 1.86E+05 | Production Example 2: Curable(2) | 0.01 or less |
| Example 8 | 60 | 30 | 0.720 | 21.60 | 4.40 | 75 | 3.72 | 2.79E+05 | Production Example 2: Curable(2) | 0.01 or less |
| Example 9 | 60 | 30 | 0.720 | 21.60 | 4.40 | 38 | 3.72 | 1.41E+05 | Production Example 3: Curable(3) | 0.01 or less |
| Example 10 | 60 | 30 | 0.720 | 21.60 | 4.40 | 50 | 3.72 | 1.86E+05 | Production Example 3: Curable(3) | 0.01 or less |
| Example 11 | 60 | 30 | 0.720 | 21.60 | 4.40 | 115 (EVA) | 0.0108 | 1.24E+03 | Production Example 4: Non-curable(1) | 0.38 |
| Example 12 | 60 | 30 | 0.048 | 1.44 | 11.40 | 38 | 3.72 | 1.41E+05 | Production Example 1: Curable(1) | 0.01 or less |
| Example 13 | 60 | 30 | 0.288 | 8.64 | 13.00 | 50 | 3.72 | 1.86E+05 | Production Example 4: Non-curable(1) | 0.38 |
| Example 14 | 60 | 30 | 0.288 | 8.64 | 13.00 | 38 | 3.72 | 1.41E+05 | Production Example 4: Non-curable(1) | 0.38 |
| Example 15 | 60 | 30 | 0.288 | 8.64 | 13.00 | 50 | 3.72 | 1.86E+05 | Production Example 3: Curable(3) | 0.01 or less |
| Example 16 | 60 | 30 | 0.288 | 8.64 | 13.00 | 38 | 3.72 | 1.41E+05 | Production Example 1: Non-curable(1) | 0.01 or less |
| Example 17 | 60 | 30 | 0.650 | 19.50 | 8.20 | 50 | 3.72 | 1.86E+05 | Production Example 3: Curable(3) | 0.01 or less |
| Example 18 | 60 | 30 | 0.288 | 8.64 | 13.00 | 38 | 3.72 | 1.41E+05 | Production Example 5: Non-curable(2) | 5.68 |

TABLE 1-continued

| | Elastic layer | | | | Stiff film (PET) layer | | | Pressure-sensitive adhesive layer | |
|---|---|---|---|---|---|---|---|---|---|
| | Thermally shrinkable film layer Thickness (μm) | Thickness (μm) | Shear modulus (MPa, 80° C.) | Shear modulus × thickness (N/m) | Pressure-sensitive adhesive power to thermally shrinkable film layer (N/10 mm, 50° C.) | Thickness (μm) | Young's modulus (GPa, 80° C.) | Young's modulus × thickness (N/m) | Composition | Pressure-sensitive adhesive power (N/10 mm, to wafer, room temperature) |
| Example 19 | 60 | 30 | 0.288 | 8.64 | 13.00 | 38 | 3.72 | 1.41E+05 | Production Example 6: Non-curable(3) | 3.17 |
| Comparative Example 1 | 60 | 105 | 0.126 | 13.23 | 4.90 | 100 | 3.38 | 3.38E+05 | Production Example 1: Curable(1) | 0.01 or less |
| Comparative Example 2 | 60 | 105 | 1.800 | 189.00 | 0.30 | 38 | 3.72 | 1.41E+05 | Production Example 1: Curable(1) | 0.01 or less |
| Comparative Example 3 | 60 | 30 | 0.720 | 21.60 | 4.40 | 100 | 3.38 | 3.38E+05 | Production Example 1: Curable(1) | 0.01 or less |
| Comparative Example 4 | 60 | 5 | 0.141 | 0.71 | 7.90 | 100 | 3.38 | 3.38E+05 | Production Example 3: Curable(3) | 0.01 or less |
| Comparative Example 5 | 60 | 30 | 0.288 | 8.64 | 13.00 | 38 | 3.72 | 1.41E+05 | Production Example 7: Non-curable(4) | 6.93 |

<Peel Test>

Each of the pressure-sensitive adhesive sheet obtained in the Examples and Comparative Examples described above was cut to a circular shape having the same size as a 4-inch silicon wafer, and was bonded to a 4-inch silicon wafer (thickness 525 μm). The rear surface of the wafer was polished to a thickness of 100 μm. For the pressure-sensitive adhesive sheet having an energy ray-curable pressure-sensitive adhesive layer as the pressure-sensitive adhesive layer and the pressure-sensitive adhesive sheet of Example 11, the energy ray-curable pressure-sensitive adhesive layer (elastic layer in the pressure-sensitive adhesive sheet of Example 11) was cured by irradiating with ultraviolet light from the pressure-sensitive adhesive sheet side at an intensity of 500 mJ/cm$^2$ (provided that for a pressure-sensitive adhesive sheet which has an energy ray-curable pressure-sensitive adhesive layer as the pressure-sensitive adhesive layer, and contains an ultraviolet reactive crosslinking agent in the elastic layer but not yet irradiated with ultraviolet ray, the elastic layer is also cured by crosslinking). The pressure-sensitive adhesive sheet was placed on a hot stage equipped with a suction chuck, such that the pressure-sensitive adhesive layer was in contact with the hot stage, and was heated to a predetermined temperature, thus to induce thermal contraction of the thermally shrinkable film layer constituting the pressure-sensitive adhesive sheet.

A case where the pressure-sensitive adhesive sheet was rolled up under heating, in one direction from an external edge portion (an end portion) toward the external edge portion on the opposite side into a tubular form and was promptly peeled off from the wafer without breaking the wafer (one-directional rolling peel) was evaluated as "A". Also, a case where the pressure-sensitive adhesive sheet rolled up from the two opposite end portions toward the center to form two tubular rolls and was promptly peeled off from the wafer without breaking the wafer (two-directional rolling peel) was evaluated as "B", and a case where the pressure-sensitive adhesive sheet was broken between the thermally shrinkable film layer and the elastic layer or was not cleanly rolled up into a tubular form, was evaluated as "C".

In all of the cases evaluated as "A" or "B" in the above, the value of r/101.6 [mm] (diameter of a circular sheet) wherein the diameter of the obtained tubular roll was designated as r [mm], was in the range of 0.001 to 0.333.

The results of the peel test are presented in Table 2. In the Table 2, "D" represents that there was no change even under heating, and "-" means that no measurement was taken (the same in Table 3).

TABLE 2

| | r/L(80° C. hot water immersion test, L = 100 mm) | Peel test (from 4-inch silicon wafer) Heating temperature (suction hot plate) | | |
|---|---|---|---|---|
| | | 70° C. | 80° C. | 90° C. |
| Example 1 | 0.06 | — | D | A |
| Example 2 | 0.06 | D | A | A |
| Example 3 | 0.055 | B | B | B |
| Example 4 | 0.045 | B | B | B |
| Example 5 | 0.06 | — | B | B |
| Example 6 | 0.095 | B | B | B |
| Example 7 | 0.065 | B | B | B |
| Example 8 | 0.1 | B | B | B |
| Example 9 | 0.05 | B | B | B |
| Example 10 | 0.045 | B | B | B |
| Example 11 | 0.055 | B | B | B |

TABLE 2-continued

|  | r/L(80° C. hot water immersion test, L = 100 mm) | Peel test (from 4-inch silicon wafer) Heating temperature (suction hot plate) | | |
|---|---|---|---|---|
|  |  | 70° C. | 80° C. | 90° C. |
| Example 12 | 0.05 | — | B | B |
| Example 13 | 0.05 | D | B | B |
| Example 14 | 0.045 | B | B | B |
| Example 15 | 0.05 | A | A | B |
| Example 16 | 0.06 | D | A | B |
| Example 17 | 0.05 | B | B | B |
| Example 18 | 0.05 | D | B | B |
| Example 19 | 0.045 | D | B | B |
| Comparative Example 1 | Anchoring fracture | — | — | — |
| Comparative Example 2 | Anchoring fracture | C | C | — |
| Comparative Example 3 | Anchoring fracture | Anchoring fracture | Anchoring fracture | Anchoring fracture |
| Comparative Example 4 | Anchoring fracture | Anchoring fracture | Anchoring fracture | Anchoring fracture |
| Comparative Example 5 | 0.05 | — | — | D |

<25-μm Thickness Wafer (8 Inch) Polish Test>

In the peel test described above, those pressure-sensitive adhesive sheets representing good results were used to perform a 25-μm thickness polish test with a silicon wafer according to the following method.

The pressure-sensitive adhesive tapes shown in Examples 1, 2, 4, 5, 7 and 8 were prepared again using a precise coating machine so as to increase the thickness precision.

Each of the prepared pressure-sensitive adhesive tapes was bonded to a 9-inch mirror wafer using DR8500II manufactured by Nitto Seiki Co., Ltd., and polished to a thickness of 25 μm using a wafer polishing apparatus DFG8560 manufactured by Disco Corporation. After polishing, one having no cracks on the wafer and an edge chipping size of 30 μm or less was evaluated as "1"; one having no cracks on the wafer and having an edge chipping size of 30 μm or greater was evaluated as "2"; and one having cracks on the wafer was evaluated as "3".

Subsequently, the warpage in the wafer after polishing was examined. For those having a polishing result of "1" or "2", the wafer was installed on a mold platen, and the distances for the two farthest location points in the distance from the mold platen to the wafer were measured.

The polishability was "1" for any of the pressure-sensitive adhesive sheets, and the amount of warpage was good, with the maximum being 7 mm. The results of the polish test are presented in Table 3.

To confirm the function of easy peelability using the self-rolling property, the pressure-sensitive adhesives of Examples 4, 5 and 7 were used to examine peeling of the pressure-sensitive adhesive sheet from a wafer polished to 25 μm and recovering the wafer as a pure body. After performing an exposure of a pressure-sensitive adhesive tape to ultraviolet light (about 500 mJ/cm$^2$), a wafer attached with the pressure-sensitive adhesive tape was installed on a suction table heated to 100° C. As a result, in all cases, the pressure-sensitive adhesive tape peeled off by self-rolling within 1 second, and the wafer could be recovered alone without any breakage. It was confirmed that an operation that would typically take 10 minutes or longer if performed manually, could be easily performed without using special instruments (indicated as "good" in the table). The results are presented in Table 3.

<Comparison of the Amount of Residual Wafer Glue (Wafer Contaminability) after Peeling of Pressure-Sensitive Adhesive Sheet>

The difference in the wafer contaminability between the peeling of tubular roll (rolling peel) and the peeling by manual operation was investigated by the following method.

Each of the pressure-sensitive adhesive tapes of Examples 4, 7 and 19 was bonded to a 4-inch mirror silicon wafer (manufactured by Shin-Etsu Semiconductor Co., Ltd, trade name "CZ-N") for contaminability evaluation, and the assembly was treated in an autoclave at 40° C. to increase the adherence. With regard to the produced samples, those using the pressure-sensitive adhesive sheets of Examples 4 and 7 were exposed to ultraviolet light (about 500 mJ/cm$^2$), and then the wafers peeled by self-rolling under heating and the wafers peeled manually at room temperature or under heating to an extent such that self-rolling does not occur, were each used for the measurement of the number of particles (those having a particle size of 0.2 μm or greater) derived from the residual glue on the wafer surface, using a Particle Counter Surfscan 6200 (manufactured by LA-Tencor Corporation).

As a result, it was found that in all cases, the glue mark was smaller in the cases of peeling by tubular roll peel. The results of wafer contaminability are presented in Table 3.

TABLE 3

|  | 25-μm thickness wafer (8-inch) polish test | | | | |
|---|---|---|---|---|---|
|  |  | Amount of | Peelability | Wafer contaminability | |
|  | Polishability | warpage after polishing | (on suction table at 100° C.) | Rolling peel | Manual peel |
| Example 1 | 1 | 7 mm | — | — | — |
| Example 2 | 1 | 7 mm | — | — | — |
| Example 4 | 1 | 1 mm or less | good | 69 | 745 |

TABLE 3-continued

| | | 25-μm thickness wafer (8-inch) polish test | | | |
|---|---|---|---|---|---|
| | | Amount of | Peelability | Wafer contaminability | |
| | Polishability | warpage after polishing | (on suction table at 100° C.) | Rolling peel | Manual peel |
| Example 5 | 1 | 3 mm | good | — | — |
| Example 7 | 1 | 3 mm | good | 97 | 163 |
| Example 8 | 1 | 7 mm | — | — | — |
| Example 19 | — | — | — | 513 | 609 |

<Practical Evaluation of Self-Rolling Pressure-Sensitive Adhesive Tape>

The following evaluation was performed for the purpose of evaluating the adequacy for the current wafer polishing process.

In the 25-μm thickness wafer polish test described above, a pressure-sensitive adhesive sheet attached to a 25 μm-thick, 8-inch silicon wafer obtained using the pressure-sensitive adhesive sheet of Example 7 was irradiated with ultraviolet light (about 500 mJ/cm$^2$). Subsequently, in order to determine as to the adequacy for actual processes, a test of peeling and recovering a dicing tape bonding and the pressure-sensitive adhesive sheet of Example 7 was performed using a dicing tape bonding/backgrind tape peeling apparatus "MA3000 II" manufactured by Nitto Seiki Co., Ltd. For the functional exhibition of self-rolling peelability, a heat source for exhibiting the self-rolling property (a drier for industrial purpose) was attached to the tape peel/recovery instrument part, and the heat source was adjusted to heat the silicon wafer to about 800° C. to 100° C.

Using the apparatus "MA3000II", a dicing tape, trade name "EM500M2A" manufactured by Nitto Denko Corporation was bonded to the polished surface side of a 8-inch silicon wafer, and a dicing ring was installed. Upon bonding the dicing tape, the wafer was heated to 50° C. to 60° C., but the pressure-sensitive adhesive sheet of Example 7 did not undergo spontaneous peel-off under this heating, and the main process was completed without any problem (for example, a peeled tape being caught in the conveying path, etc.). Thereafter, when the sample was conveyed to the tape peel/recovery instrument of "MA3000II", hot air was blown from the heat source to the side of the pressure-sensitive adhesive sheet of Example 7 to heat the wafer edge portion. As a result, the pressure-sensitive adhesive sheet of Example 7 spontaneously rolled from the wafer edge portion to peel off for about 5 to 10 mm from the wafer edge portion. At this point, the pressure-sensitive adhesive sheet of Example 7 was peeled from the silicon wafer by the tape peel instrument of "MA3000II". Here, the silicon wafer did not develop any crack or chipping. Furthermore, due to the concern for any adverse effect (for example, increase in pressure-sensitive adhesive power, etc.) of heating on the dicing tape upon peeling, the dicing tape of the sample was also subjected to a functional evaluation after peeling, but there was no problem.

From these results, it was determined that the pressure-sensitive adhesive sheet of the present invention was applicable to actual processes.

While the invention has been described in detail and with reference to specific embodiments thereof it will be apparent to one skilled in the art that various changes and modifications can be made therein without departing from the scope thereof. This application is based on Japanese patent application No. 2006-305671 filed Nov. 10, 2006 and Japanese patent application No. 2007-260077 filed Oct. 3, 2007, the entire contents thereof being hereby incorporated by reference.

Further, all references cited herein are incorporated in their entireties.

What is claimed is:

1. A self-rolling pressure-sensitive adhesive sheet, comprising:
   a shrinkable film layer which is contractible in at least one axial direction;
   a restriction layer which restricts a contraction of the shrinkable film layer, said restriction layer being disposed on a side of the shrinkable film layer; and
   a pressure-sensitive adhesive layer disposed on the side of the restriction layer which is opposite to the side on which the shrinkable film layer is disposed,
   said self-rolling pressure-sensitive adhesive sheet being a releasable pressure-sensitive adhesive sheet,
   wherein the restriction layer comprises an elastic layer on the shrinkable film layer side and a non-shrinkable film layer on the side opposite to the shrinkable film layer side,
   wherein the elastic layer has a thickness of from 15 to 150 μm and a shear modulus at 80° C. of from $1 \times 10^4$ Pa to $5 \times 10^6$ Pa, and
   wherein the pressure-sensitive adhesive layer or the pressure-sensitive adhesive layer after an adhesiveness decreasing treatment has a pressure-sensitive adhesive power (180° peeling, against a silicon mirror wafer, tensile speed: 300 mm/min) of 6.5 N/10 mm or less, and
   wherein the self-rolling pressure-sensitive adhesive sheet rolls up in one direction from an end to form one tubular roll or rolls up from two opposing ends toward a center of the two opposing ends to form two tubular rolls, when a heat treatment is applied to the self-rolling pressure-sensitive adhesive sheet at a predetermined temperature within a range of from 70° C. to 180° C., so that the self-rolling pressure-sensitive sheet is stimulated to induce the contraction of the shrinkable film layer.

2. The self-rolling pressure-sensitive adhesive sheet according to claim 1, wherein the shrinkable film layer comprises a thermally shrinkable film having a thermal shrinkage rate in a principal shrinking direction of from 30 to 90% at a temperature within a range of from 70 to 180° C.

3. The self-rolling pressure-sensitive adhesive sheet according to claim 1, wherein the elastic layer has a product of a shear modulus at 80° C. and a thickness within a range of from 1 to 1000 N/m.

4. The self-rolling pressure-sensitive adhesive sheet according to claim 1, wherein the non-shrinkable film layer has a product of a Young's modulus at 80° C. and a thickness within a range of from $3.0 \times 10^5$ N/m or less.

5. The self-rolling pressure-sensitive adhesive sheet according to claim 1, wherein the elastic layer is formed by a crosslinking acrylic pressure-sensitive adhesive.

6. The self-rolling pressure-sensitive adhesive sheet according to claim 1, wherein the pressure-sensitive adhesive layer is formed by an energy ray-curable pressure-sensitive adhesive.

7. The self-rolling pressure-sensitive adhesive sheet according to claim 1, wherein, when the self-rolling pressure-sensitive adhesive sheet rolls up after the stimulation to the self-rolling pressure-sensitive adhesive sheet inducing the contraction of the shrinkable film layer to thereby form a tubular roll, the formed tubular roll has a ratio (r/L) within a range of from 0.001 to 0.333, wherein r is a diameter of the tubular roll and L is a length of the self-rolling pressure-sensitive adhesive sheet in a rolling direction.

8. The self-rolling pressure-sensitive adhesive sheet according to claim 1, wherein, when the self-rolling pressure-sensitive adhesive sheet rolls up after the stimulation to the self-rolling pressure-sensitive adhesive sheet inducing the contraction of the shrinkable film layer to thereby form two tubular rolls, the tubular rolls each has a ratio (r/L) within a range of from 0.001 to 0.333, wherein r is a diameter of the tubular roll and L is a length of the self-rolling pressure-sensitive adhesive sheet in a rolling direction.

9. The self-rolling pressure-sensitive adhesive sheet according to claim 1, wherein the heat treatment is applied to the self-rolling pressure-sensitive adhesive sheet at a predetermined temperature within a range of from 90° C. to 140° C.

* * * * *